US011088125B2

(12) United States Patent
Lai et al.

(10) Patent No.: US 11,088,125 B2
(45) Date of Patent: Aug. 10, 2021

(54) IPD MODULES WITH FLEXIBLE CONNECTION SCHEME IN PACKAGING

(71) Applicant: Taiwan Semiconductor Manufacturing Company, Ltd., Hsinchu (TW)

(72) Inventors: Yu-Chia Lai, Zhunan Township (TW); Cheng-Chieh Hsieh, Tainan County (TW); Tin-Hao Kuo, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/572,798

(22) Filed: Sep. 17, 2019

(65) Prior Publication Data

US 2021/0082888 A1    Mar. 18, 2021

(51) Int. Cl.

| H01L 29/00 | (2006.01) |
|---|---|
| H01L 23/34 | (2006.01) |
| H01L 23/02 | (2006.01) |
| H01L 21/00 | (2006.01) |
| H01L 21/4763 | (2006.01) |

(Continued)

(52) U.S. Cl.
CPC ............ *H01L 25/16* (2013.01); *H01L 21/561* (2013.01); *H01L 23/3107* (2013.01); *H01L 23/4012* (2013.01); *H01L 24/24* (2013.01); *H01L 24/25* (2013.01); *H01L 24/73* (2013.01);

*H01L 24/82* (2013.01); *H01L 2023/4087* (2013.01); *H01L 2224/24137* (2013.01); *H01L 2224/24147* (2013.01); *H01L 2224/2518* (2013.01); *H01L 2224/25171* (2013.01); *H01L 2224/73209* (2013.01); *H01L 2924/1205* (2013.01); *H01L 2924/1431* (2013.01); *H01L 2924/1434* (2013.01)

(58) Field of Classification Search
CPC ......... H01L 24/24; H01L 24/25; H01L 24/73; H01L 24/82; H01L 25/16; H01L 21/561; H01L 21/563; H01L 23/4012; H01L 23/481; H01L 25/10567; H01L 23/3107
See application file for complete search history.

(56) References Cited

U.S. PATENT DOCUMENTS 8,164,171 B2 * 4/2012 Lin ..................... H01L 23/5385
257/686
8,269,343 B2 9/2012 Meguro
(Continued)

FOREIGN PATENT DOCUMENTS

JP    2009076522 A    4/2009
KR    20160088233 A    7/2016
(Continued)

*Primary Examiner* — Alonzo Chambliss
(74) *Attorney, Agent, or Firm* — Slater Matsil, LLP

(57) ABSTRACT

A package includes a first package and a second package over and bonded to the first package. The first package includes a first device die, and a first encapsulant encapsulating the first device die therein. The second package includes an Independent Passive Device (IPD) die, and a second encapsulant encapsulating the IPD die therein. The package further includes a power module over and bonded to the second package.

19 Claims, 25 Drawing Sheets

(51) Int. Cl.
  *H01L 25/16* (2006.01)
  *H01L 21/56* (2006.01)
  *H01L 23/00* (2006.01)
  *H01L 23/40* (2006.01)
  *H01L 23/31* (2006.01)

(56) References Cited

U.S. PATENT DOCUMENTS

| | | | |
|---|---|---|---|
| 8,896,109 B2* | 11/2014 | Pagaila | H01L 24/17 257/678 |
| 10,672,741 B2* | 6/2020 | Yu | H01L 24/97 |
| 2007/0254404 A1* | 11/2007 | Gerber | H01L 25/162 438/109 |
| 2008/0174008 A1* | 7/2008 | Yang | G11C 5/063 257/723 |
| 2018/0053746 A1* | 2/2018 | Yu | H01L 24/97 |
| 2019/0006315 A1 | 1/2019 | Hsu et al. | |
| 2019/0103375 A1 | 4/2019 | Huang et al. | |
| 2019/0109083 A1 | 4/2019 | Yu et al. | |
| 2019/0115300 A1 | 4/2019 | Yu et al. | |

FOREIGN PATENT DOCUMENTS

| | | |
|---|---|---|
| TW | 201906116 A | 2/2019 |
| TW | 201916191 A | 4/2019 |
| TW | 201921526 A | 6/2019 |

* cited by examiner

IPD MODULES WITH FLEXIBLE CONNECTION SCHEME IN PACKAGING

BACKGROUND

The packages of integrated circuits are becoming increasing complex, with more device dies packaged in the same package to form a system having more functions. Independent Passive Devices (IPDs), which are discrete devices, are often used in the packages. The IPDs are often bonded to the front side of Integrated Fan-Out (InFO) packages, and are formed at the same level as power modules. Accordingly, the IPDs occupy the area that otherwise may be used for forming the power modules, forcing the solder balls for bonding the power modules to be formed smaller. This also causes the current density in the solder balls to be adversely increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
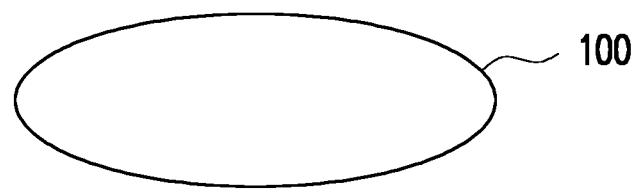
FIGS. 1 through 6 illustrate the cross-sectional views of intermediate stages in the formation of Independent Passive Devices (IPD) modules in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including Independent Passive Devices (IPDs) and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, an IPD package, which is an Integrated Fan-Out (InFO) package, is formed by encapsulating IPDs therein. The IPD package is then bonded to a device package having device dies therein, and may be bonded between a power module and the device package.

Figure 4:
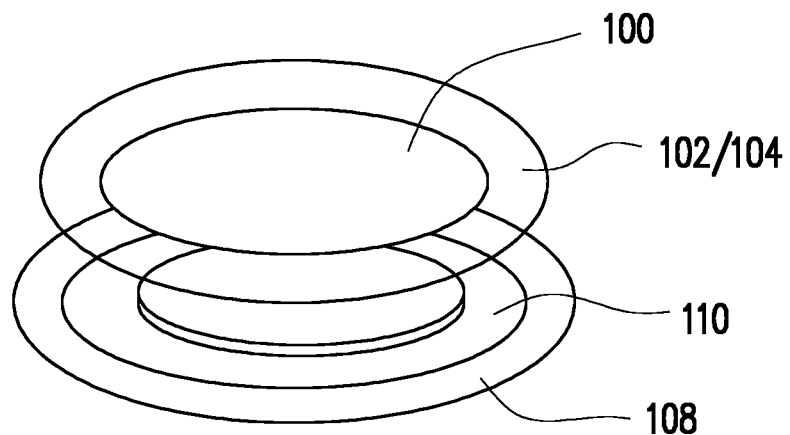
Figure 5:
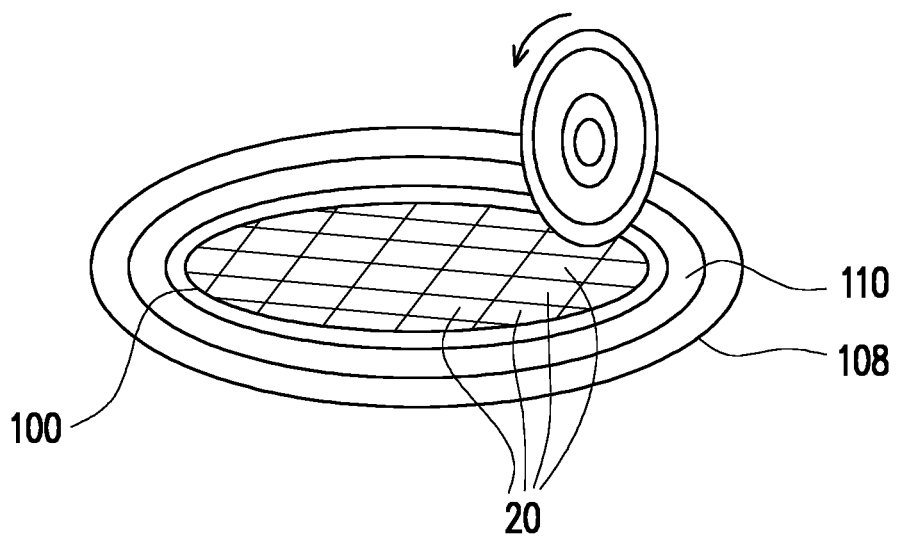
Figure 6:
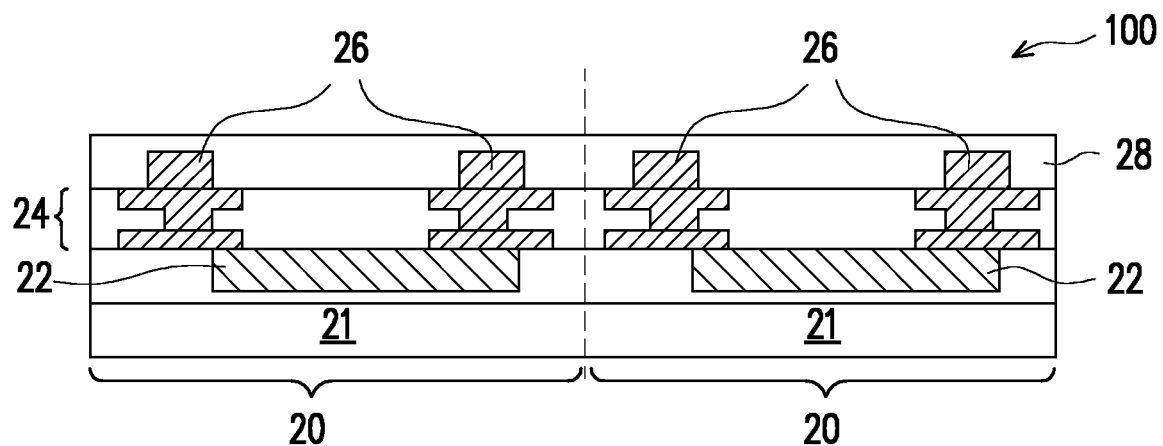
Figure 34:
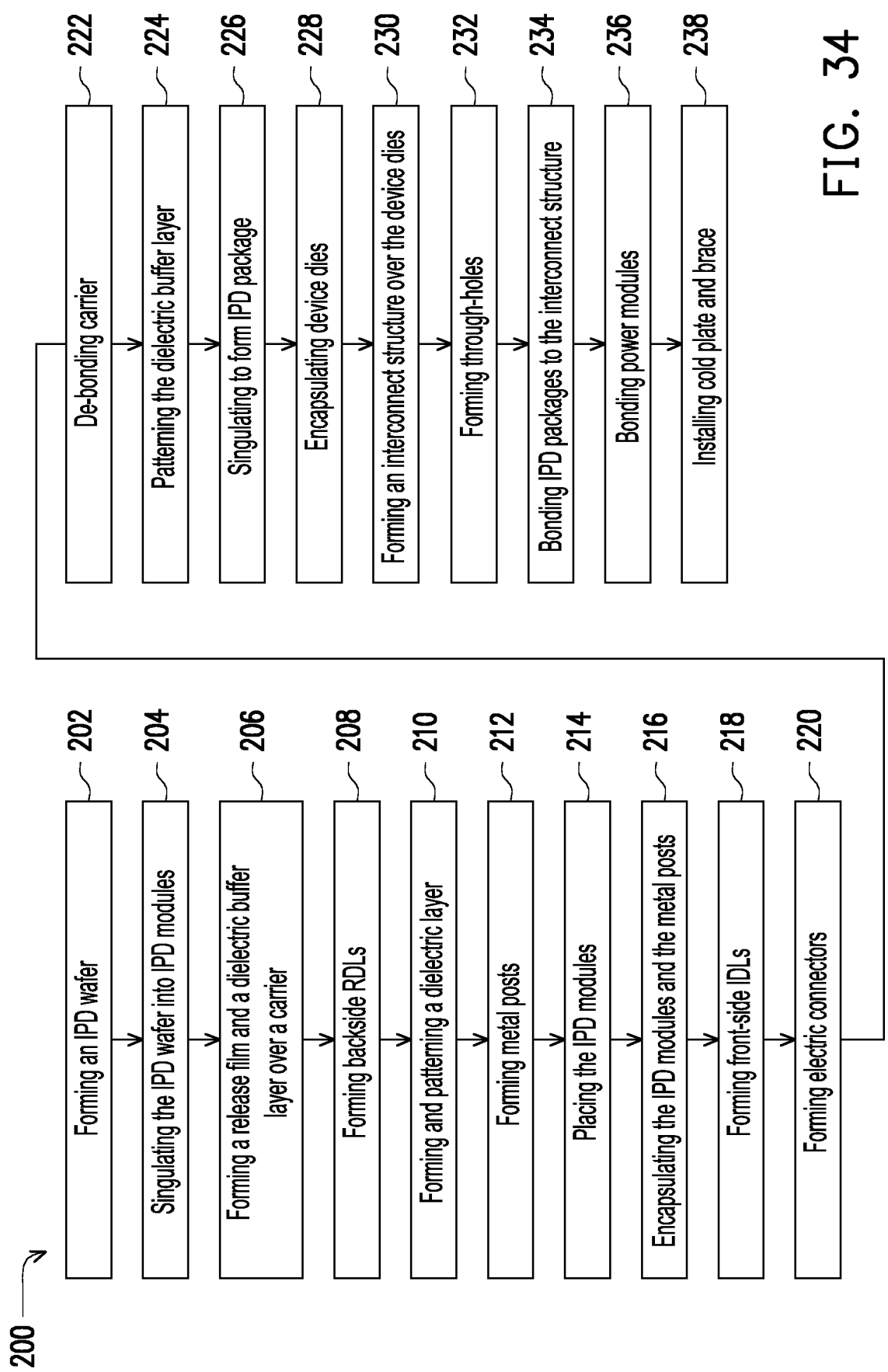
FIG. 34 illustrates a process flow for forming a package in accordance with some embodiments.

FIGS. 1 through 6 illustrate the cross-sectional views of intermediate stages in the formation of IPD modules in accordance with some embodiments. Referring to FIG. 1, an IPD wafer 100 is formed. The respective process is illustrated as process 202 in the process flow 200 shown in FIG. 34. IPD wafer 100 includes a plurality of IPD dies 20 (FIG. 5) therein, wherein FIG. 6 schematically illustrates the cross-sectional view of example IPD dies 20 in accordance with some embodiments. As shown in FIG. 6, IPD die 20 includes passive device 22 therein. Passive device 22 may be a capacitor, a resistor, an inductor, or the like. Passive device 22 may be formed over substrate 21, which may be a semiconductor substrate such as a silicon substrate in accordance with some embodiments. Interconnect structure 24 is formed over substrate 21. One IPD die 20 may include a single type (such as capacitor, resistor, inductor, or the like) of passive device therein, and may be free from active devices therein. Passive device 22 may be formed in or over substrate 21, such as in interconnect structure 24, which includes a plurality of dielectric layers. Passive device 22 is connected to terminals 26, which may be metal pillars, metal pads, or the like. In accordance with some embodiments, an IPD die 20 has only two terminals 26, each connected to an end of the passive device 22. In accordance with some embodiments, an IPD die 20 has more than two terminals. Protection layer 28 is formed to cover terminals 26. In accordance with some embodiments of the present disclosure, protection layer 28 is formed of a polymer such as polyimide, polybenzoxazole (PBO), or the like.

Figure 2:
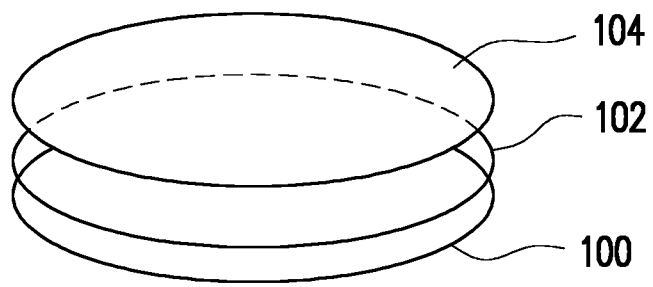
Figure 3:
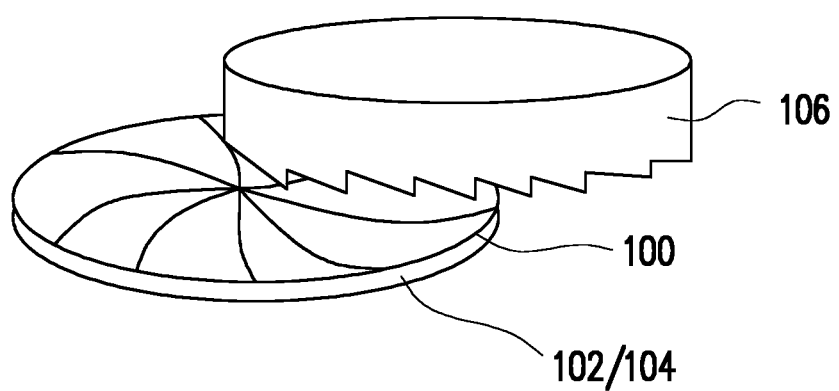

Referring to FIG. 2, IPD wafer 100 is adhered to a Backside Grinding (BG) tape 104 through protection layer 102 for protecting the front surface of wafer 100. Next, as shown in FIG. 3, a backside grinding is performed to thin IPD wafer 100, wherein grinder 106 is illustrated schematically. In a subsequent process, as shown in FIG. 4, a Die-attach film (DAF, not shown, refer to DAF 46 in FIG. 16) is adhere to the back surface of IPD wafer 100, and dicing tape 110 is adhered to the DAF. Dicing tape 110 and BG tape 104 are on the opposite sides of IPD wafer 100. Frame 108 is used for supporting dicing tape 110. BG tape 104 and protection layer 102 are then removed.

Referring to FIG. 5, IPD wafer 100 is sawed (singulated) apart into a plurality of IPD modules 120. The respective process is illustrated as process 204 in the process flow 200 shown in FIG. 34. Each of the plurality of IPD modules 120 may include a single IPD die or a plurality of IPD dies. When the IPD modules 120 includes a plurality of IPD dies 20 unsawed apart from each other, the layers in the plurality of IPD dies 20 are continuously connected to form continuous layers. For example, the semiconductor substrates 21 of the plurality of IPD dies 20 are continuously connected with each other to form a continuous semiconductor substrate. The interconnect structures 24 of the plurality of IPD dies 20 are also continuously connected with each other to form a continuous interconnect structure.

Figure 7:
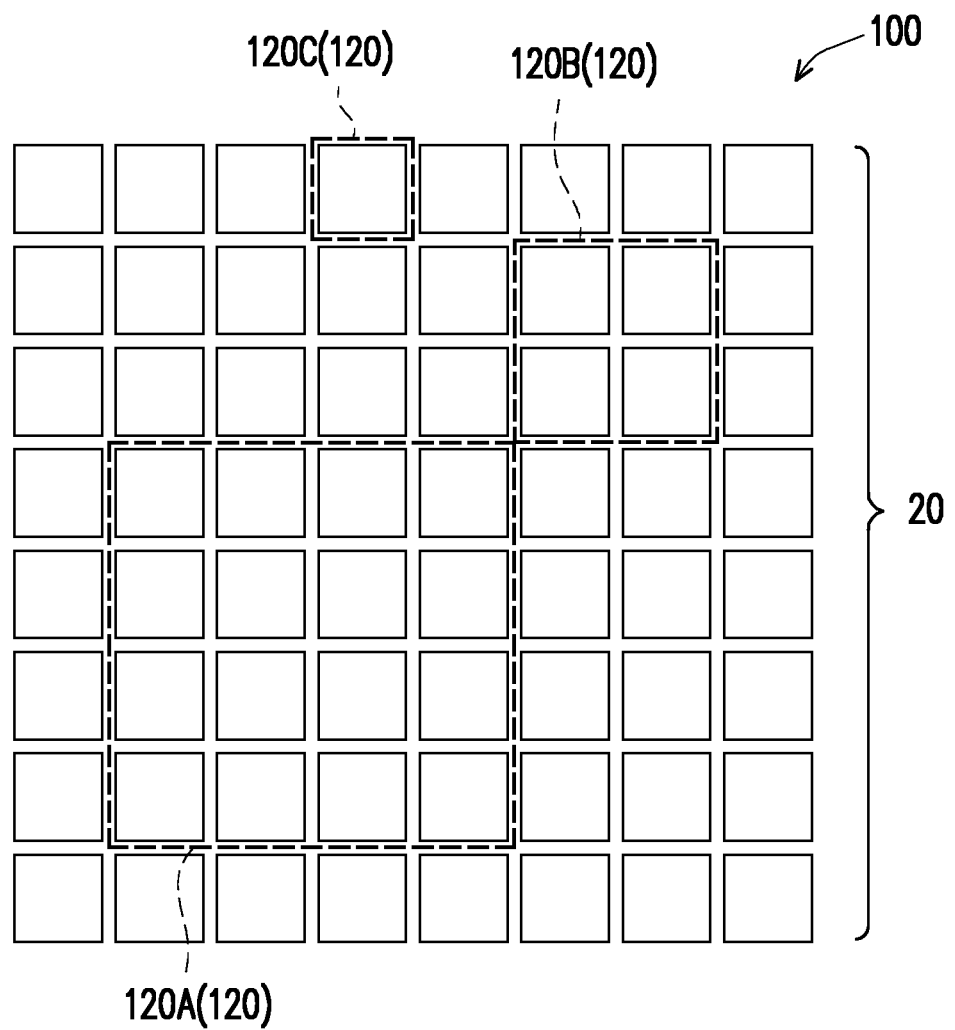
FIGS. 7 through 12 illustrate the flexible IPD design in accordance with some embodiments.
Figure 8:
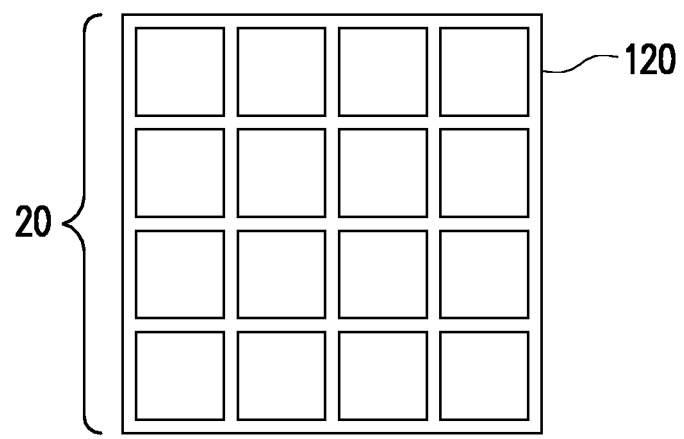

FIG. 7 illustrates a portion of IPD wafer 100, which includes a plurality of IPD dies 20 arranged as an array. IPD modules 120 including different numbers of IPD dies 20 may be sawed from IPD wafer 100. As some examples, IPD module 120A includes a 4×4 array of IPD dies 20. IPD module 120B includes a 2×2 array of IPD dies 20. IPD module 120C includes a single IPD die 20. The number of IPD dies in the IPD module 120 depends on various factors such as the size of the device die 80 (FIG. 28), and the intended capacitance, resistance, or inductance value of the IPD module 120, or the like. For example, if a greater capacitance is needed, IPD module 120 may include more IPD dies 20 (capacitor dies), which may be connected in parallel to achieve the intended capacitance. FIG. 8 illustrates an example IPD module 120 in accordance with some embodiments.

Figure 9:
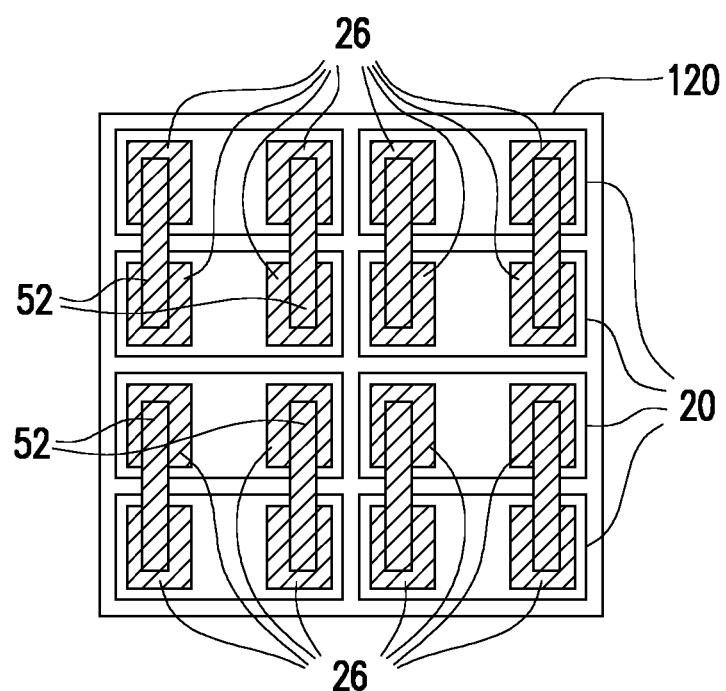

The embodiments of the present disclosure provide flexibility in the connection of IPD dies 20 when an IPD module 120 includes a plurality of IPD dies 20. For example, FIG. 9 illustrates an example connection scheme for connecting 8 IPD dies 20 into four IPD devices, which may be further connected into fewer IPD devices, or each of the four IPD devices may be used separately in the final structure. In the example as shown in FIG. 9, the terminals 26 of two neighboring IPD dies 20 are connected through redistribution lines (or pads) 52. Accordingly, when IPD dies 20 are capacitor dies, the capacitance is at least doubled through the connection using redistribution lines 52.

Figure 12:
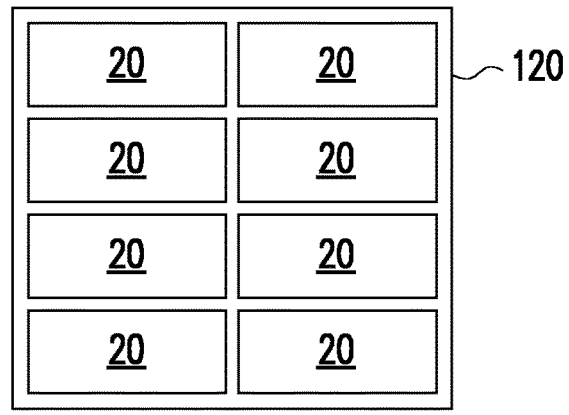

In accordance with some embodiments, as shown in FIG. 8, IPD dies 20 may have a square top-view shape. In accordance with alternative embodiments, IPD dies 20 may have an elongated shape, as shown in FIG. 12. In accordance with some embodiments, the length and the width of IPD dies 20 are in the range between about 50 μm and about 2,000 μm.

FIGS. 13 through 21 illustrate the cross-sectional views of intermediate stages in the formation of an InFO package including IPD modules 120 in accordance with some embodiments of the present disclosure. The corresponding processes are also reflected schematically in the process flow 200 shown in FIG. 34.

Figure 13:
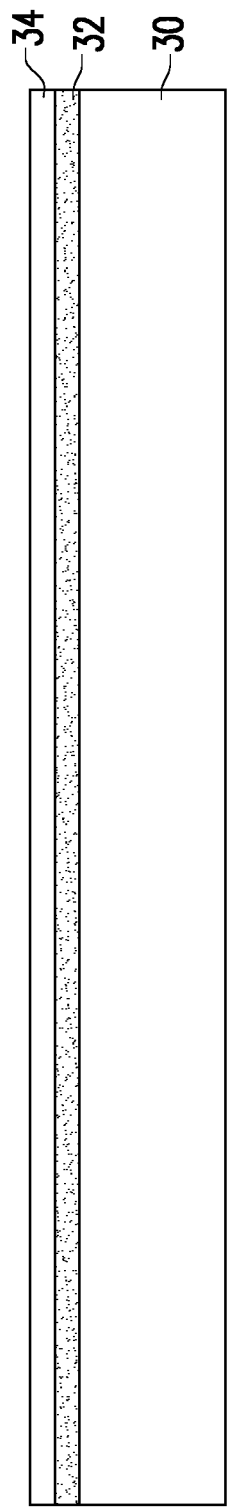
FIGS. 13 through 21 illustrate the cross-sectional views of intermediate stages in the packaging of an IPD-containing Integrated Fan-Out (InFO) package in accordance with some embodiments.

Referring to FIG. 13, carrier 30 is provided, and release film 32 is coated on carrier 30. The respective process is illustrated as process 206 in the process flow 200 shown in FIG. 34. Carrier 30 is formed of a transparent material, and may be a glass carrier, a ceramic carrier, an organic carrier, or the like. Release film 32 is in physical contact with the top surface of carrier 30. Release film 32 may be formed of a Light-To-Heat-Conversion (LTHC) coating material. Release film 32 may be applied onto carrier 30 through coating. In accordance with some embodiments of the present disclosure, the LTHC coating material is capable of being decomposed under the heat of light/radiation (such as a laser beam), and hence can release carrier 30 from the structure formed thereon.

In accordance with some embodiments, dielectric buffer layer 34 is formed on LTHC coating material 32. Dielectric buffer layer 34 may be formed of a polymer such as PBO, polyimide, benzocyclobutene (BCB), or another applicable polymer.

Figure 14:
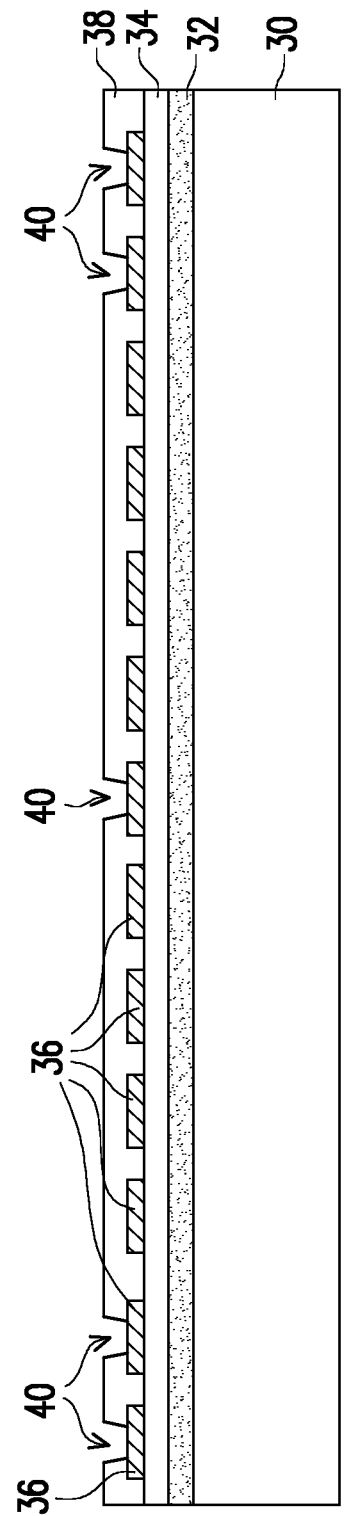

Referring to FIG. 14, backside RDLs (and metal pads) 36 are formed. The respective process is illustrated as process 208 in the process flow 200 shown in FIG. 34. The formation process may include depositing a metal seed layer (not shown), forming and patterning a plating mask (such as photo resist, not shown) over the metal seed layer, and plating a metallic material such as copper and/or aluminum over the metal seed layer. The metal seed layer may include a titanium layer and a copper layer over the titanium layer, and may be formed using, for example, Physical Vapor Deposition (PVD). The metal seed layer and the plated metallic material may be formed of the same material or different materials. The patterned plating mask is then removed, followed by etching the portions of the metal seed layer previously covered by the patterned plating mask. The remaining portions of the metal seed layer and the plated metallic material are RDLs 36. Dielectric layer 38 is then formed on RDLs 36. The respective process is illustrated as process 210 in the process flow 200 shown in FIG. 34. Dielectric layer 38 may be formed of PBO, polyimide, or the like. A patterning process is then performed to form openings 40, through which the metal pads/RDLs 36 are revealed. The patterning process may include a light-exposure process and a development process.

Figure 15:
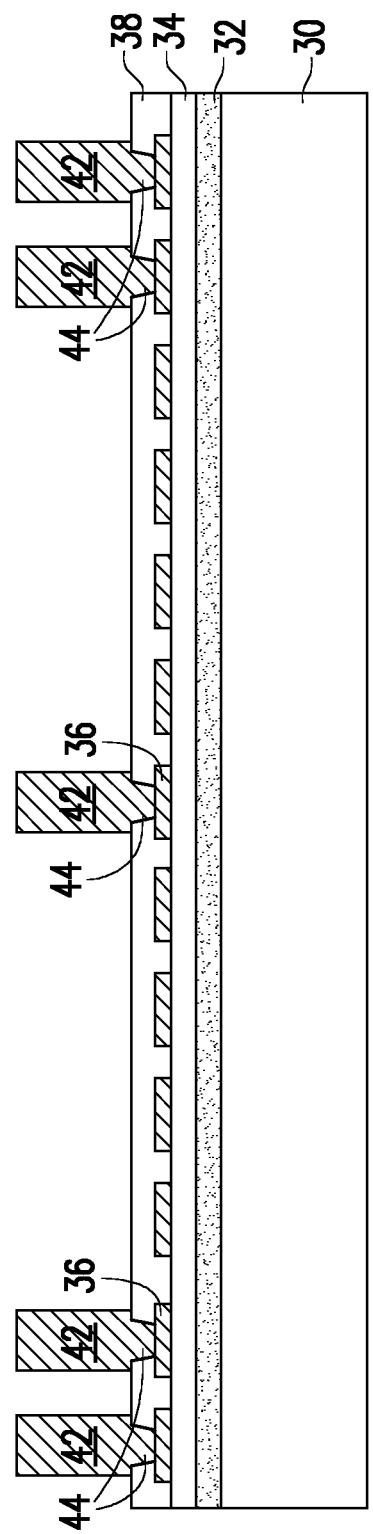

FIG. 15 illustrates the formation of metal posts 42. The respective process is illustrated as process 212 in the process flow 200 shown in FIG. 34. Throughout the description, metal posts 42 are alternatively referred to as through-vias 42 since metal posts 42 penetrate through the subsequently dispensed encapsulating material. The formation of metal posts 42 may be similar to the formation of RDLs 36, except the plated metallic material of metal posts 42 has a significantly greater height than that of the RDLs 36. When metal posts 42 are formed, vias 44 are simultaneously formed in openings 40 (FIG. 14).

Figure 16:
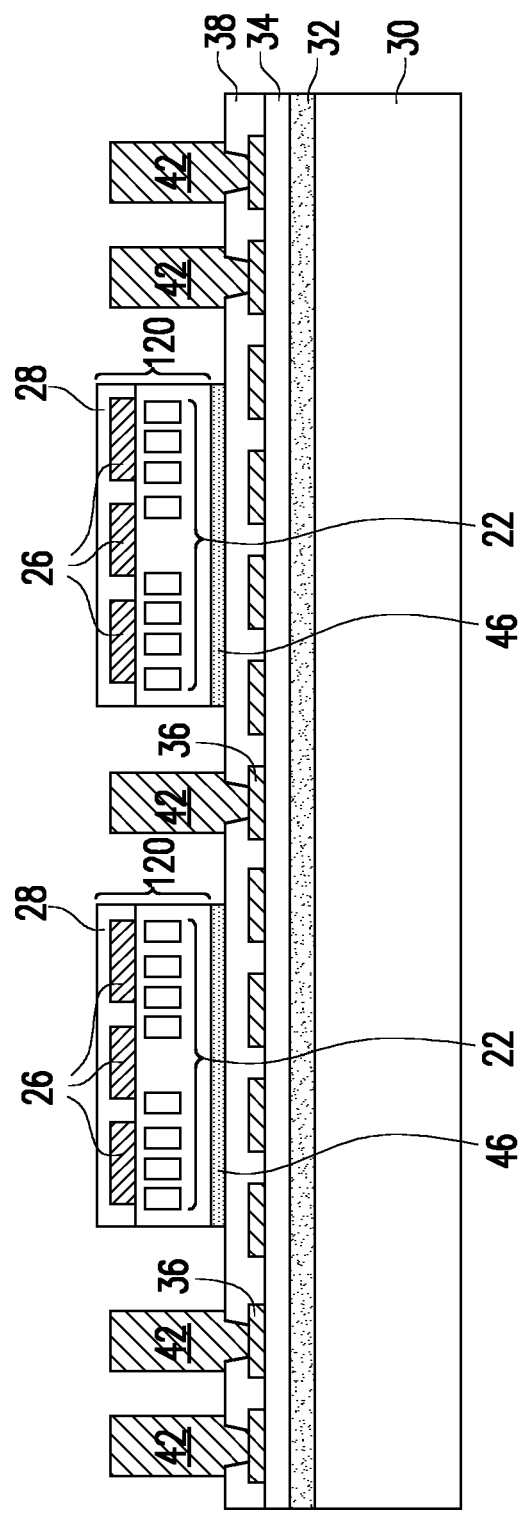

FIG. 16 illustrates the placement/attachment of IPD modules 120. The respective process is illustrated as process 214 in the process flow 200 shown in FIG. 34. IPD modules 120 are attached to dielectric layer 38 through DAFs 46. There may be a plurality of IPD modules 120 placed on dielectric layer 38. IPD modules 120 may be identical as each other, or may be different from each other, for example, including different numbers of IPD dies 20 from each other. The passive devices 22 in IPD modules 120 are schematically illustrated. The IPD modules 120 may have the same type of passive devices or different types of devices. For example, one of the IPD modules 120 may include capacitor dies, while another one of the IPD modules 120 may include resistor dies.

Figure 17:
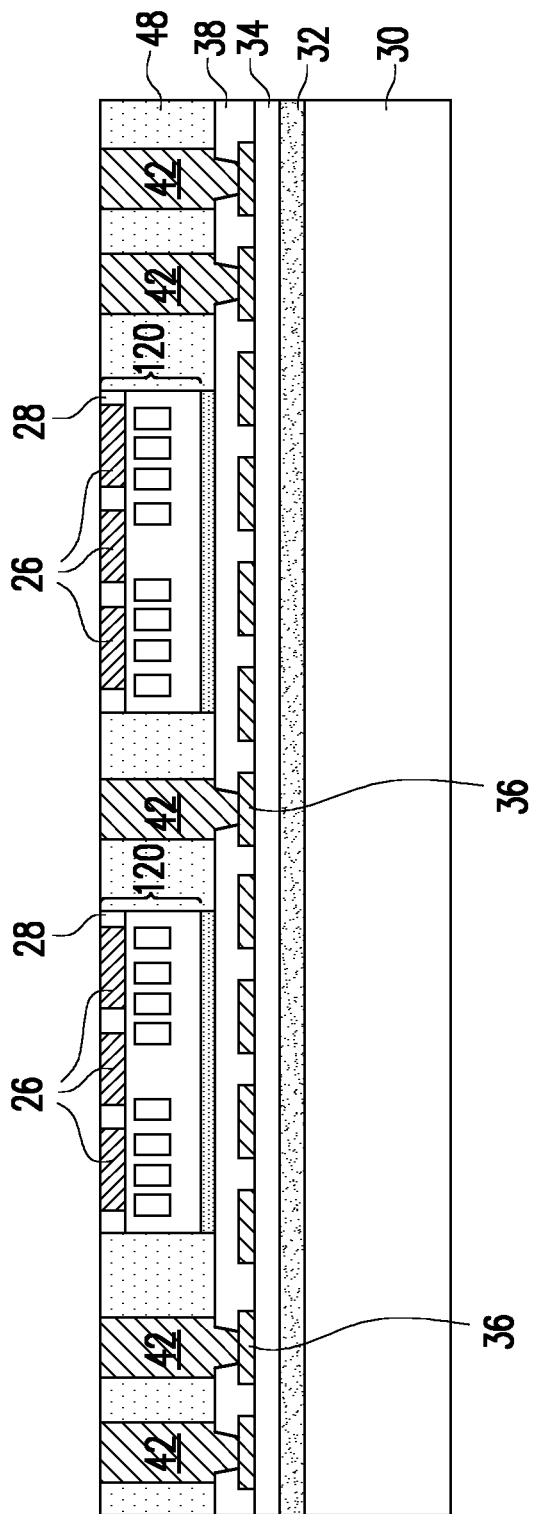

Next, encapsulant 48 is dispensed to encapsulate IPD module 120 and metal posts 42, as shown in FIG. 17, and is then cured. The respective process is illustrated as process 216 in the process flow 200 shown in FIG. 34. Encapsulant 48 fills the gaps between neighboring metal post 42 and the gaps between metal post 42 and IPD modules 120. Encapsulant 48 may include a molding compound, a molding underfill, an epoxy, and/or a resin. Encapsulant 48 is dispensed to a level so that the top surface of encapsulant 48 is higher than the top ends of terminals 26 and dielectric layer 28. When formed of molding compound or molding underfill, encapsulant 48 may include a base material, which may be a polymer, a resin, an epoxy, or the like, and filler particles (not shown) in the base material. The filler particles may be dielectric particles of $SiO_2$, $Al_2O_3$, silica, or the like, and may have spherical shapes. Also, the spherical filler particles may have the same or different diameters.

Subsequent to the dispensing of encapsulant 48, as also shown in FIG. 17, a planarization process such as a Chemical Mechanical Polish (CMP) process or a mechanical grinding process is performed to planarize encapsulant 48 and dielectric layers 28, until metal posts 42 and terminals 26 are all exposed. Due to the planarization process, the top ends of metal posts 42 are substantially level (coplanar) with the top surfaces of terminals 26, and are substantially coplanar with the top surface of encapsulant 48. Metal posts 42 are alternatively referred to as through-vias 42 hereinafter since metal posts 42 penetrate through encapsulant 48.

Figure 18:
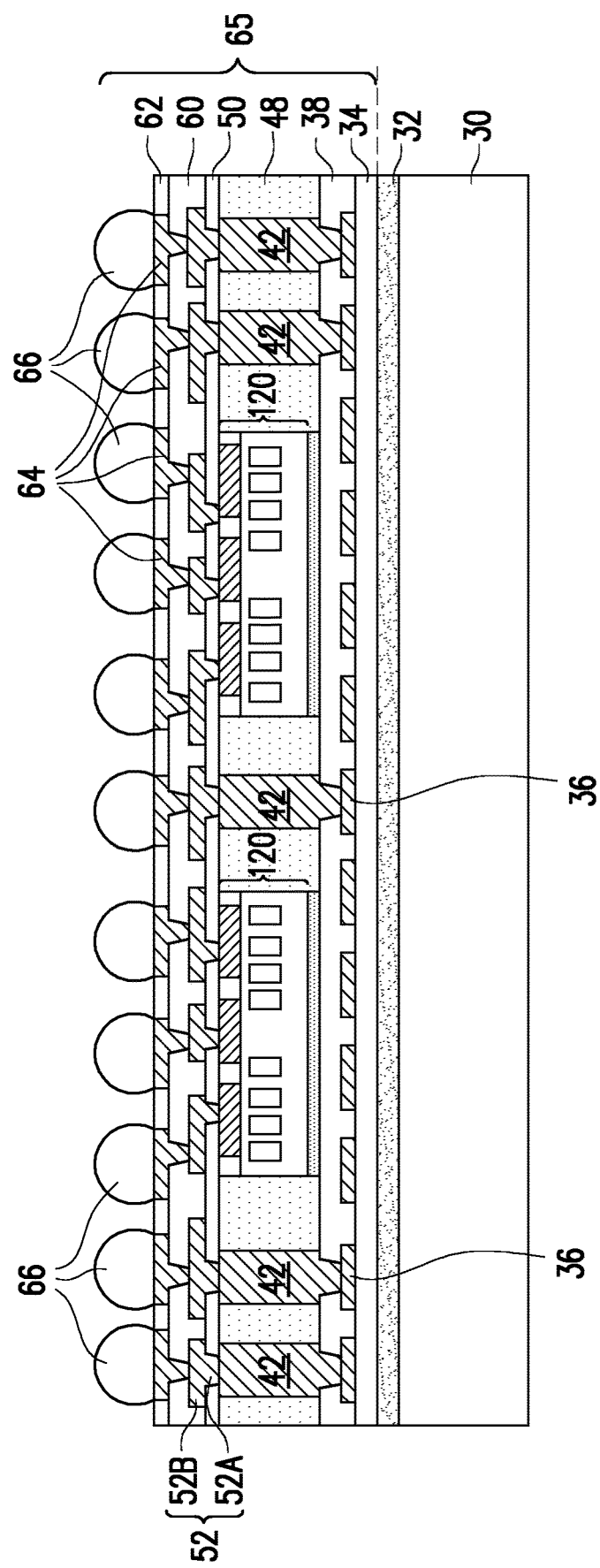

FIG. 18 illustrates the formation of a front-side redistribution structure, which includes a plurality of RDLs and the respective dielectric layers. The respective process is illustrated as process 218 in the process flow 200 shown in FIG. 34. The formation processes are discussed briefly as follows. Referring to FIG. 18, dielectric layer 50 is first formed. In accordance with some embodiments of the present disclosure, dielectric layer 50 is formed of a polymer such as PBO, polyimide, or the like. The formation process includes coating dielectric layer 50 in a flowable form, curing dielectric layer 50, and performing a light-exposure process and a development process to pattern dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings (occupied by RDLs 52) are then formed, for example, through an etching process. Through-vias 42 and terminals 26 are exposed through the openings in the patterned dielectric layer 50.

Next, RDLs 52 are formed. RDLs 52 include vias 52A formed in dielectric layer 50 to connect to terminals 26 and through-vias 42, and metal traces (metal lines) 52B over dielectric layer 50. In accordance with some embodiments of the present disclosure, RDLs 52 are formed using a plating process, which may be essentially the same as the process for forming RDLs 36. Although one layer of RDLs 52 is illustrated, there may be more RDLs formed. Dielectric layers 60 and 62 and RDLs 64 are then formed. Dielectric layers 60 and 62 may be formed of a material(s) selected from the same group of candidate materials as dielectric layer 50. For example, dielectric layers 60 and 62 may be formed using PBO, polyimide, or BCB. RDLs 64 may also include some Under-Bump Metallurgies (UBMs), which are also denoted as RDLs 64. In accordance with some embodiment of the present disclosure, RDLs 64 are formed of nickel, copper, titanium, or multi-layers thereof. In accordance with some embodiments, RDLs 64 include a titanium layer and a copper layer over the titanium layer. Although two layers of RDLs 52 and 64 are illustrated, the front-side RDLs may include a single RDL layer or more than two RDL layers.

FIG. 18 also illustrates the formation of electrical connectors 66 in accordance with some embodiments. The respective process is illustrated as process 220 in the process flow 200 shown in FIG. 34. The formation of electrical connectors 66 may include placing solder balls on the exposed portions of RDLs 64, and then reflowing the solder balls, and hence electrical connectors 66 are solder regions. In accordance with alternative embodiments of the present disclosure, the formation of electrical connectors 66 includes performing a plating step to form solder layers over RDLs 64, and then reflowing the solder layers. Electrical connectors 66 may also include non-solder metal pillars, or metal pillars and solder caps over the non-solder metal pillars, which may also be formed through plating. Throughout the description, the structure including dielectric layer 34 and the overlying structure in combination is referred to as composite package 65 or reconstructed wafer 65.

Figure 19:
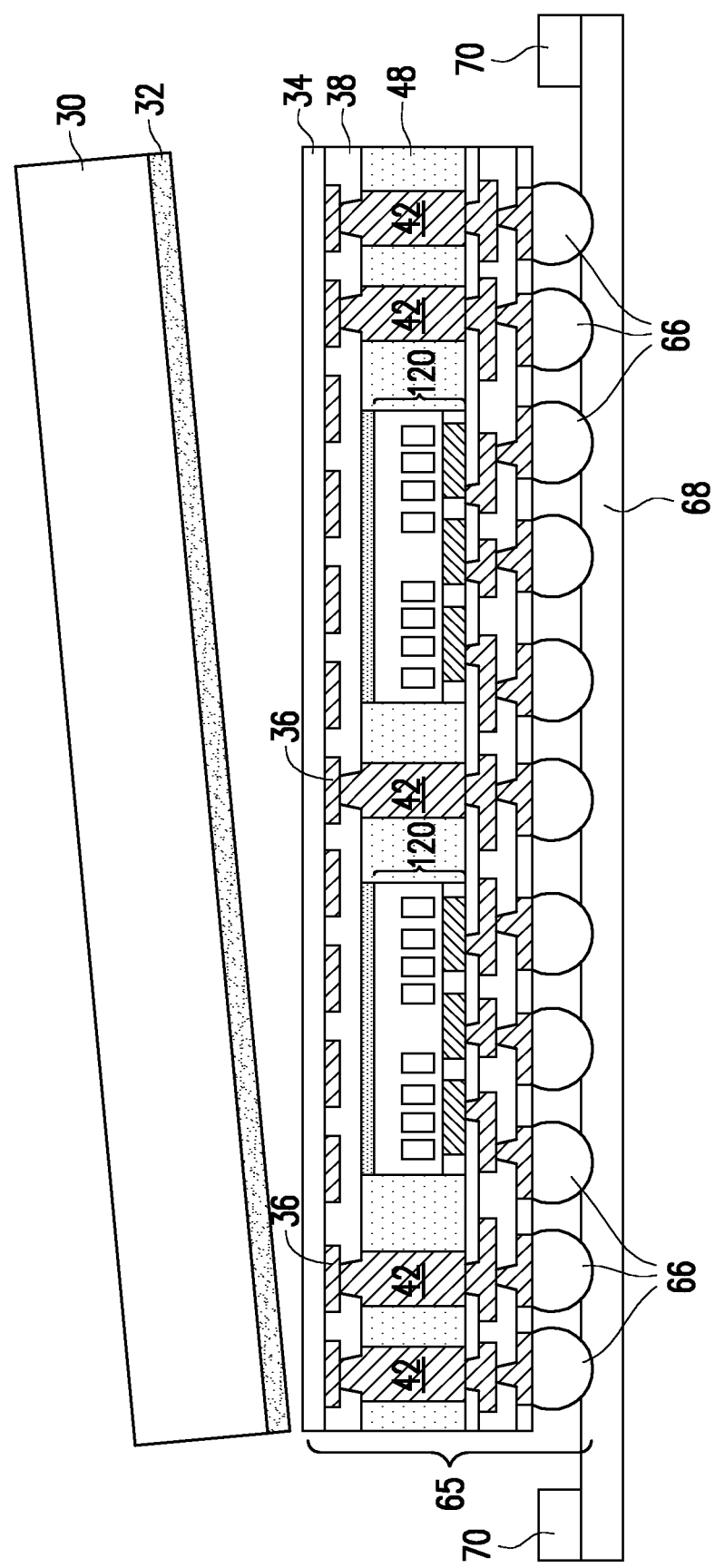

Next, referring to FIG. 19, reconstructed wafer 65 is placed on tape 68, which is attached to frame 70. In accordance with some embodiments of the present disclosure, electrical connectors 66 are in contact with tape 68. Next, a light beam is projected on LTHC coating material 32, and the light beam penetrates through the transparent carrier 30. In accordance with some embodiments of the present disclosure, the light beam is a laser beam, which scans through the entire LTHC coating material 32.

Figure 20:
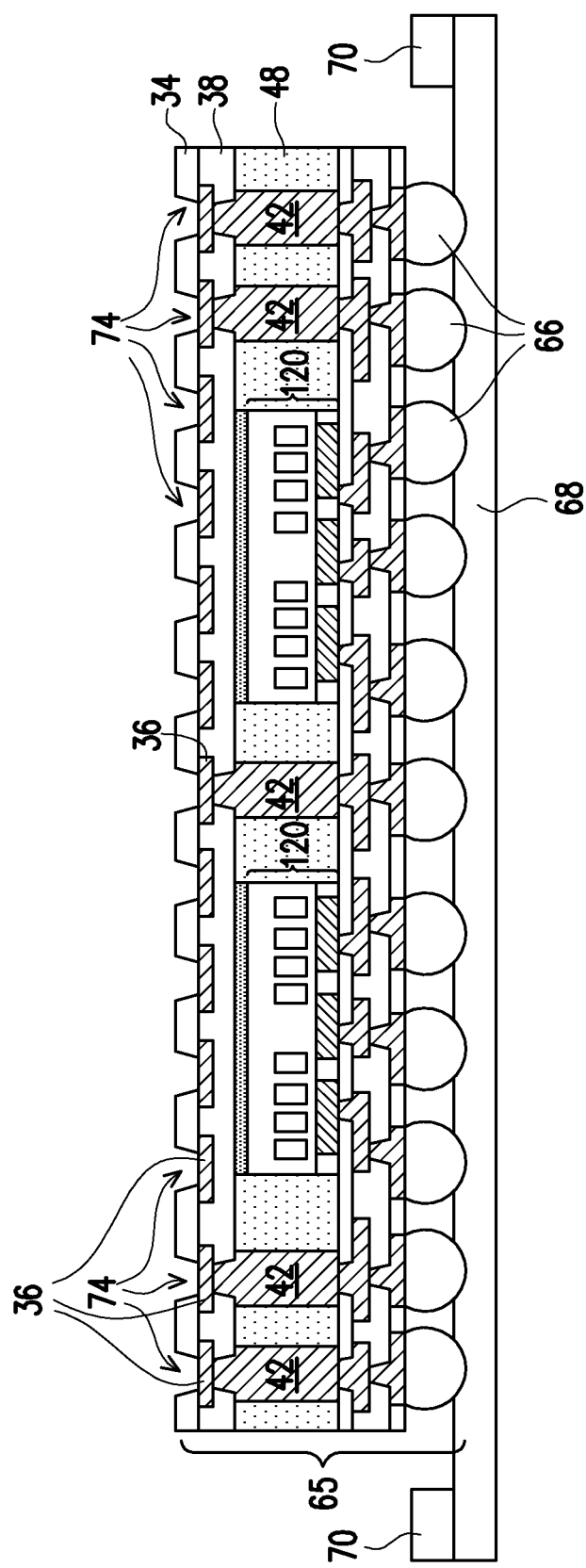

As a result of the light-exposure (such as the laser scanning), carrier 30 may be lifted off from LTHC coating material 32, and hence reconstructed wafer 65 is de-bonded (demounted) from carrier 30. The respective process is illustrated as process 222 in the process flow 200 shown in FIG. 34. During the light exposure, LTHC coating material 32 is decomposed in response to the heat introduced by the light beam, allowing carrier 30 to be separated from the reconstructed wafer 65. The residue of LTHC coating material 32 is then removed, for example, through a plasma cleaning step. The resulting reconstructed wafer 65 is shown in FIG. 20.

Figure 21:
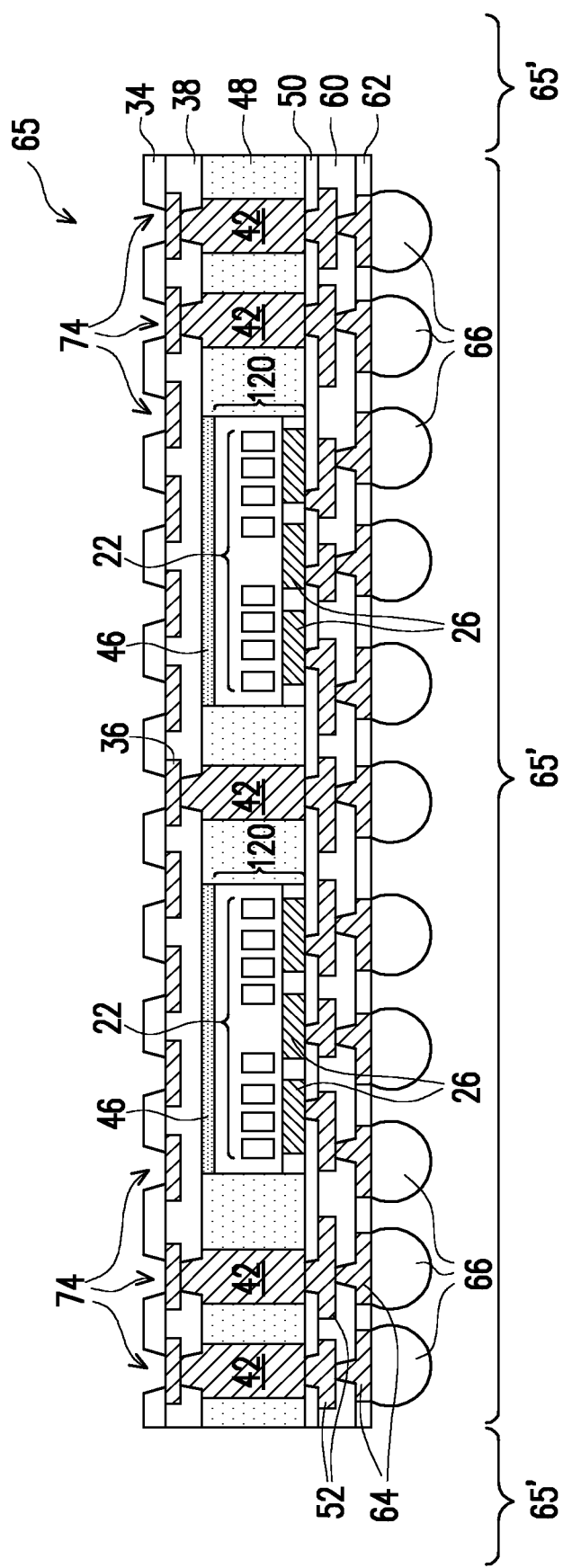
Figure 22:
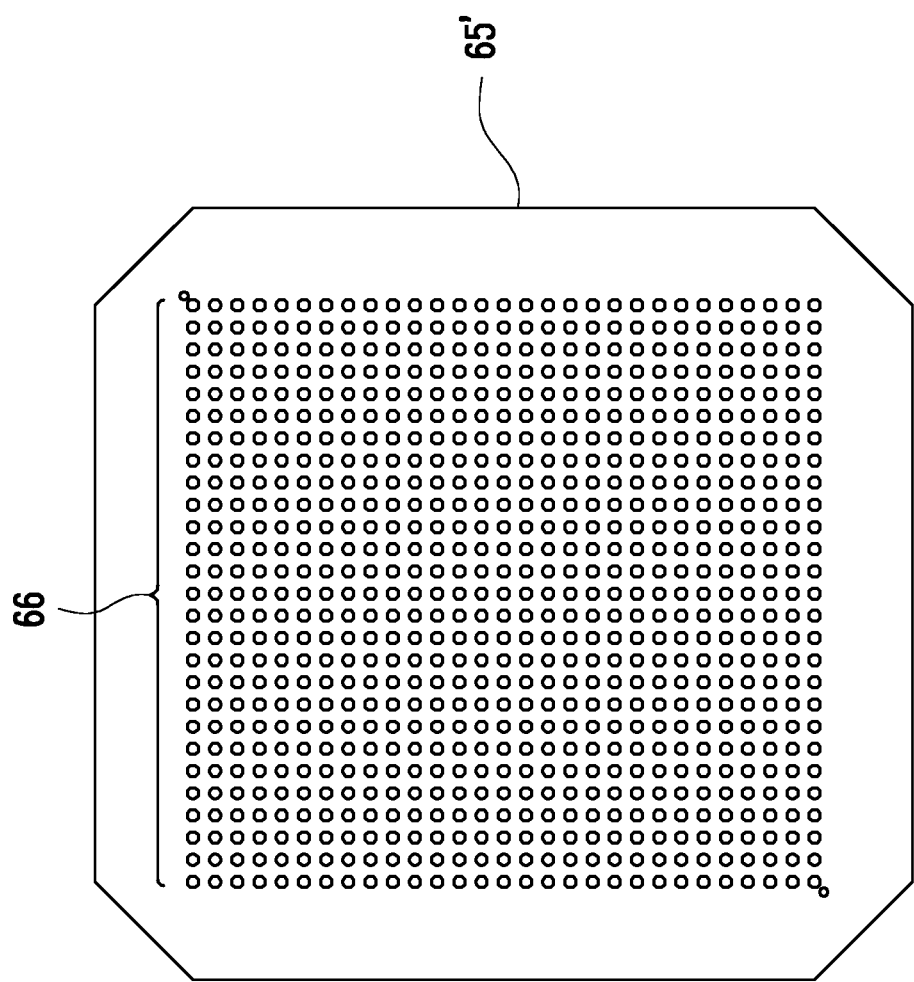
FIG. 22 illustrates a plane view of an InFO package including an IPD device in accordance with some embodiments.

After the de-bonding of carrier 30, dielectric buffer layer 34 is exposed as a surface portion of reconstructed wafer 65. Referring to FIG. 20, dielectric buffer layer 34 is patterned to form openings 74, through which the metal pads of RDLs 36 are revealed. The respective process is illustrated as process 224 in the process flow 200 shown in FIG. 34. In accordance with some embodiments of the present disclosure, the patterning is performed through laser drill. In a subsequent process, tape 68 and frame 70 are removed from the reconstructed wafer 65, and the resulting reconstructed wafer 65 is illustrated in FIG. 21. The reconstructed wafer 65 is then singulated into a plurality of identical IPD packages 65', which are illustrated in FIGS. 21 and 22. The respective process is illustrated as process 226 in the process flow 200 shown in FIG. 34.

Figure 28:
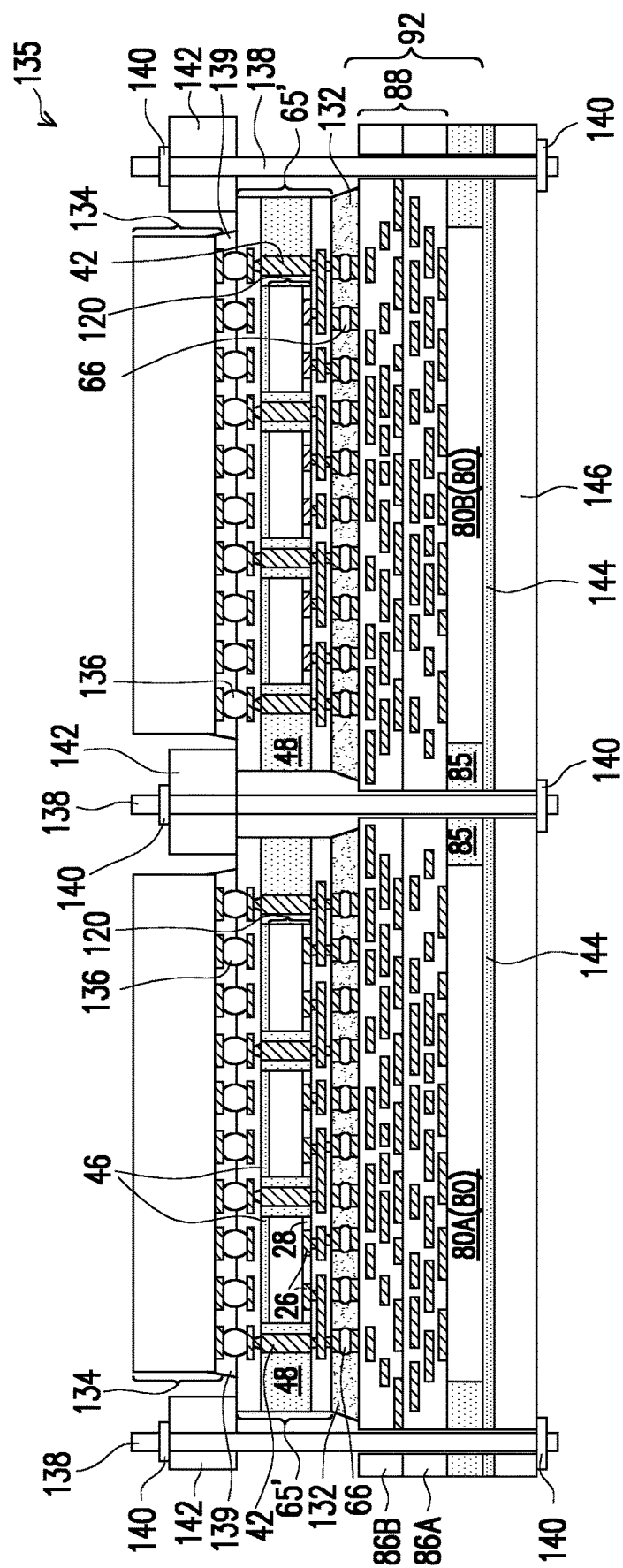

FIG. 22 illustrates a plane view (a top view or a bottom view) of IPD package 65'. The plurality of electrical connectors 66 are also illustrated. In accordance with some embodiments of the present disclosure, the corners of IPD package 65' are cut. This may provide space for the subsequently inserted screws 138 (FIG. 28).

FIGS. 23 through 28 illustrate the cross-sectional views of intermediate stages in the formation of a system package including IPD packages therein in accordance with some embodiments of the present disclosure. The corresponding processes are also reflected schematically in the process flow 200 shown in FIG. 34.

Figure 23:
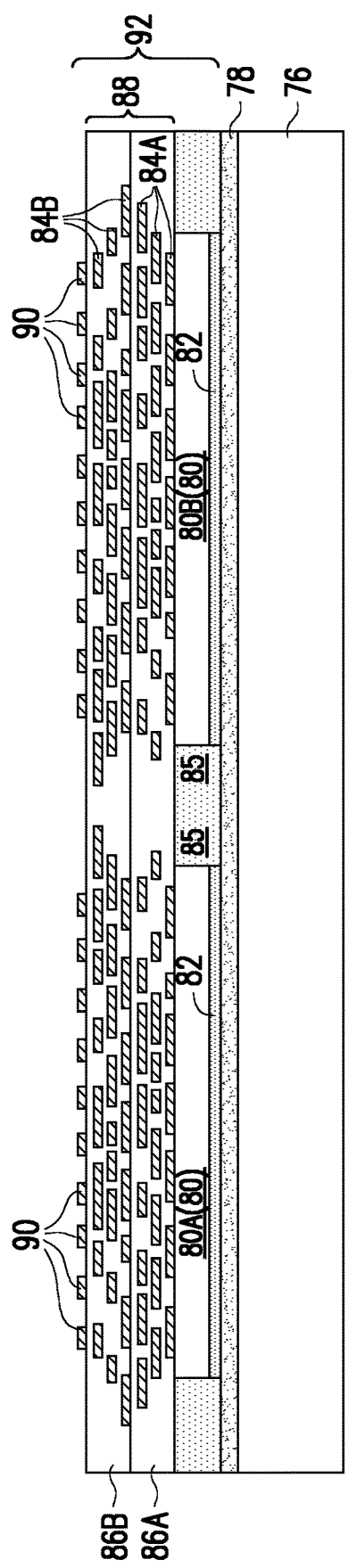
FIGS. 23 through 28 illustrate the cross-sectional views of intermediate stages in the formation of a system including an IPD-containing InFO package(s) in accordance with some embodiments.

Referring to FIG. 23, carrier 76 and release film 78 are provided. Carrier 76 and release film 78 may be formed of essentially the same materials as that of carrier 30 and release film 32 (FIG. 14), respectively. Also, carrier 76 may have a round top-view shape. There may be, or may not be, an additional buffer layer (not shown) over release film 78, and the additional buffer layer (when formed) may be formed of PBO, polyimide, BCB, or the like.

Device dies 80 (including 80A and 80B) are then placed over release film 78, for example, through DAFs 82. Device dies 80 may include semiconductor substrates and integrated circuit devices (such as active devices, which include transistors, for example, not shown) at the front surface (the surface facing up) of the respective semiconductor substrates. In accordance with some embodiments of the present disclosure, device dies 80 may include logic dies, which may include Central Processing Unit (CPU) dies, Graphic Processing Unit (GPU) dies, mobile application dies, Micro Control Unit (MCU) dies, BaseBand (BB) dies, Application processor (AP) dies, Field-Programmable Gate Array (FPGA) dies, Application-Specific Integrated Circuit (ASIC) dies, or the like. Device dies 80 may also include memory dies, input-output (IO) dies, or the like. The memory dies may include High-Bandwidth Memory (HBM) stacks, Hybrid Memory Cubes (HMC), Dynamic Random Access Memory (DRAM) dies, Static Random Access Memory (SRAM) dies, or the like.

Figure 32:
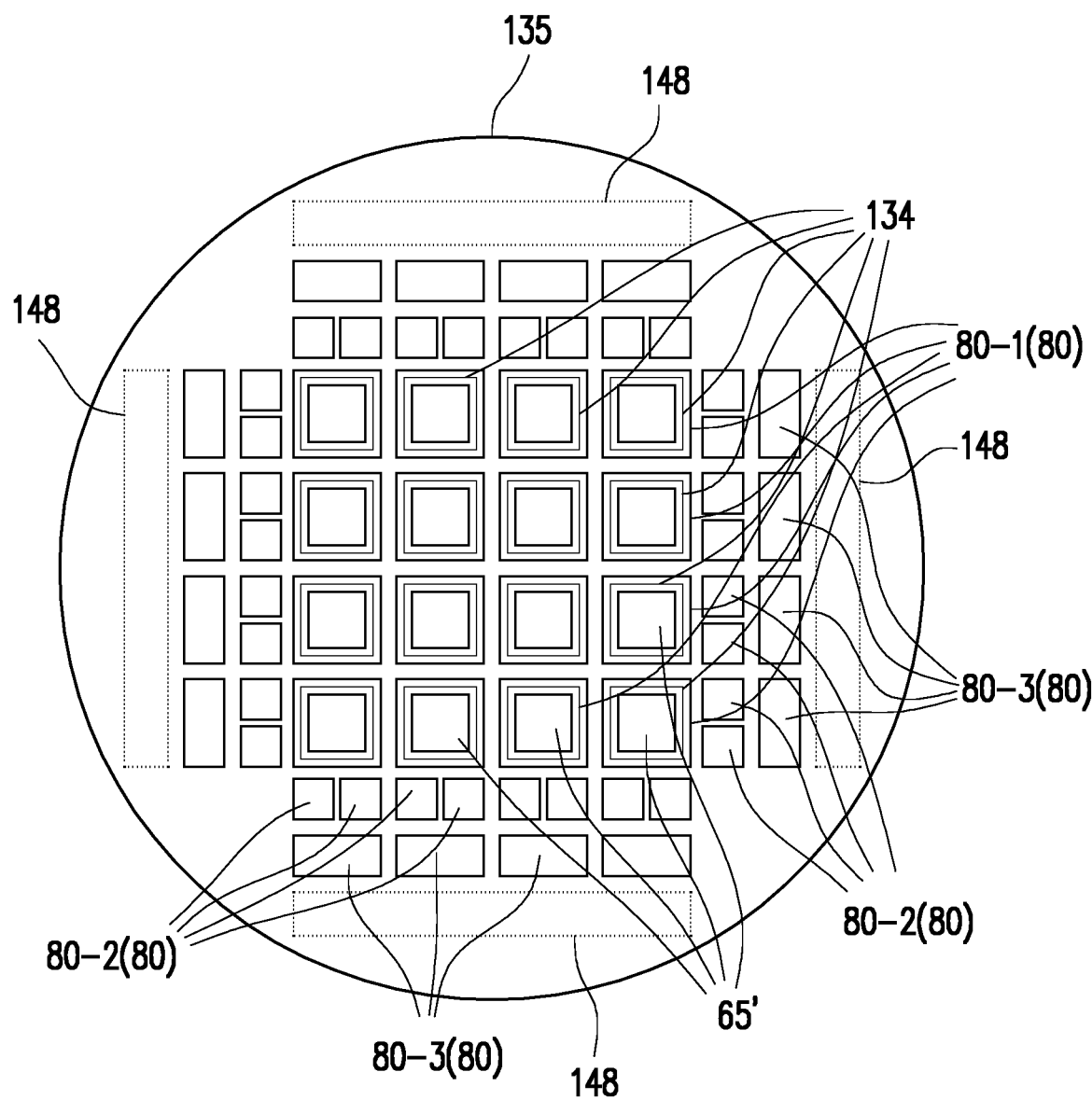
FIG. 32 illustrates a plane view of an example layout of a reconstructed wafer in accordance with some embodiments.

In accordance with some embodiments, device dies 80A and 80B represent a plurality of device dies having different sizes, different structures, and/or different functions, and may include some or all of the aforementioned types of dies in any combination. For example, FIG. 32 illustrates an example layout of device dies 80 placed on the same carrier 76. In accordance with some embodiments of the present disclosure, as shown in FIG. 32, device 80 may include computing logic dies 80-1, memory dies 80-2, and IO dies 80-3. In accordance with some embodiments, all of the device dies 80 are used in a same system such as an Artificial Intelligence (AI) system, and device dies 80 are not separated into different packages, and will all remain in the same final package. In accordance with alternative embodiments, all of the illustrated device dies 80-1, 80-2, and 80-3 may represent a device die group that functions as a system, and there may be a plurality of identical systems placed on the same carrier 76. In accordance with these embodiments, the plurality of systems will be separated in a subsequent singulation process.

Referring back to FIG. 23, device dies 80 are encapsulated in encapsulant 85. The respective process is illustrated as process 228 in the process flow 200 shown in FIG. 34. In accordance with some embodiments, encapsulant 85 includes a molding compound, a molding underfill, an epoxy, a resin, or the like. When formed of molding compound or molding underfill, encapsulant 85 may include a base material, which may be a polymer, a resin, an epoxy, or the like, and filler particles (not shown) in the base material. A planarization process is performed until the electrical connectors (such as metal pillars or metal pads, not shown) of device dies 80 are exposed. In subsequent processes, interconnect structure 88 is formed over encapsulant 85 and device dies 80. The respective process is illustrated as process 230 in the process flow 200 shown in FIG. 34. In accordance with some embodiments of the present disclosure, interconnect structure 88 includes dielectric layers 86A and dielectric layers 86B over dielectric layer 86A. Each of the dielectric layers 86B may be thicker than any of the dielectric layers 86A. Dielectric layers 86A may be formed of a photo-sensitive material(s) such as PBO, polyimide, or the like. Dielectric layers 86B may be formed of a non-photo-sensitive material such as molding compound or molding underfill.

RDLs 84A are formed in dielectric layers 86A, and RDLs 84B are formed in dielectric layers 86B. In accordance with some embodiments, RDLs 84B are thicker and/or wider than RDLs 84A, and may be used for long-range electrical routing, while RDLs 84A may be used for short-range electrical routing. Electrical connectors 90 are formed on the surface of interconnect structure 88. Electrical connectors 90 and RDLs 84A and 84B are electrically connected to device dies 80. Throughout the description, the structure over release film 78 is referred to as InFO package 92, which is also a reconstructed wafer.

Figure 24:
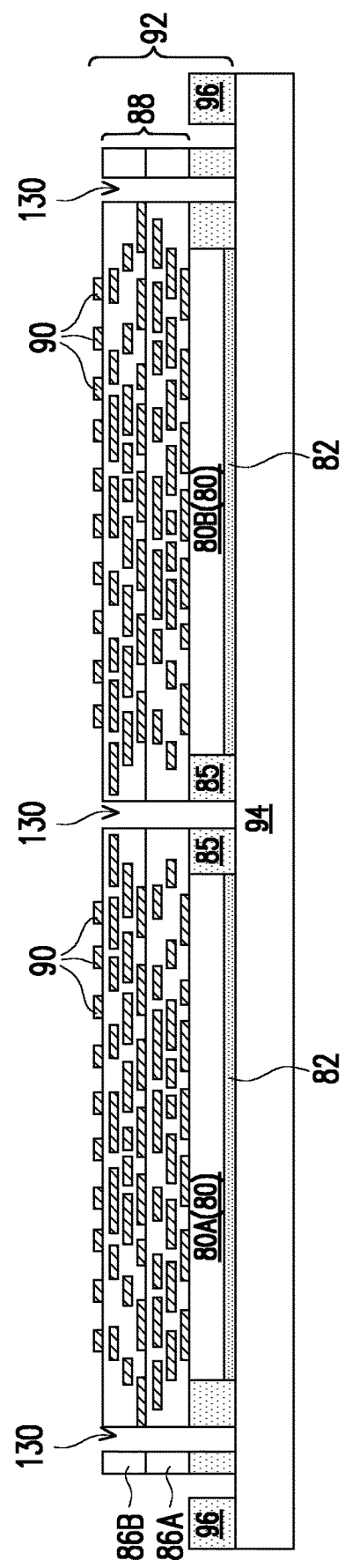
Figure 31:
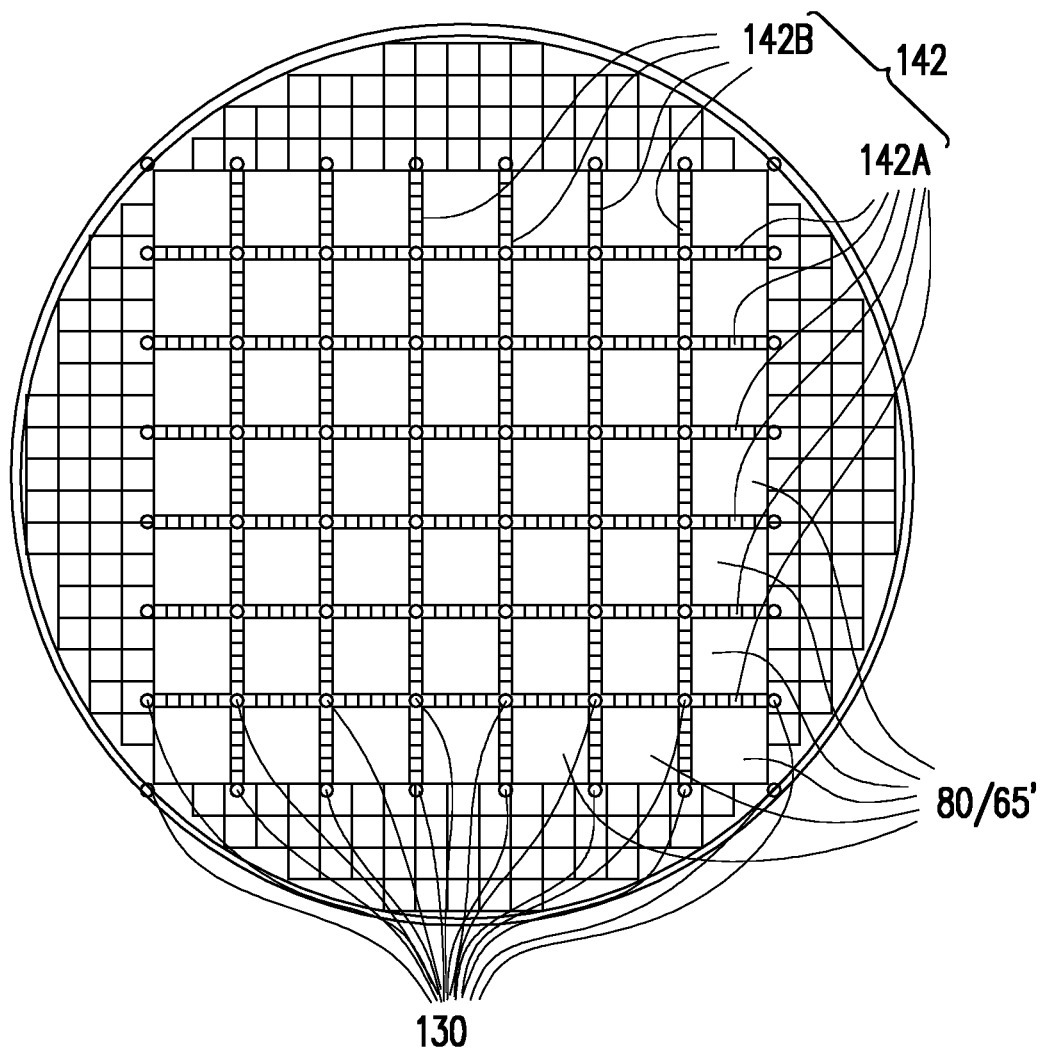
FIG. 31 illustrates a plane view of a reconstructed wafer including IPD-containing InFO package(s) in accordance with some embodiments.

In a subsequent process, carrier 76 is de-bonded from InFO package 92. In accordance with some embodiments of the present disclosure, DAFs 82 (FIG. 23) are removed, for example, using a CMP process or a mechanical grinding process. In accordance with alternative embodiments, DAFs 82 are left un-removed, and are attached to tape 94. InFO package 92 is then attached to tape 94, which is further attached to frame 96, as shown in FIG. 24. In accordance with some embodiments, through-holes 130 are formed to penetrate through InFO package 92. The respective process is illustrated as process 232 in the process flow 200 shown in FIG. 34. Through-holes 130 may be formed through laser drill, drilling through a drill bit, or the like. FIG. 31 illustrates an example distribution of through-holes 130. Device dies 80 (and the subsequently bonded IPD packages 65') may be allocated as an array, and through-holes 130 may be located at the corners of the device dies 80 and IPD packages 65'. In accordance with other embodiments, no through-holes are formed.

Figure 25:
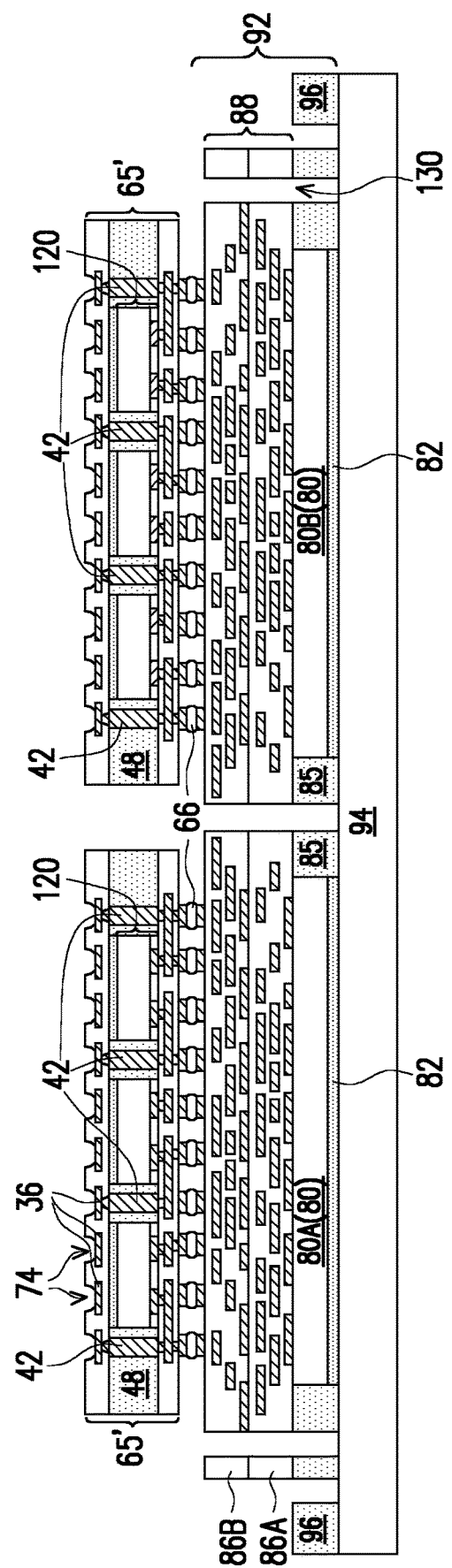
Figure 26:
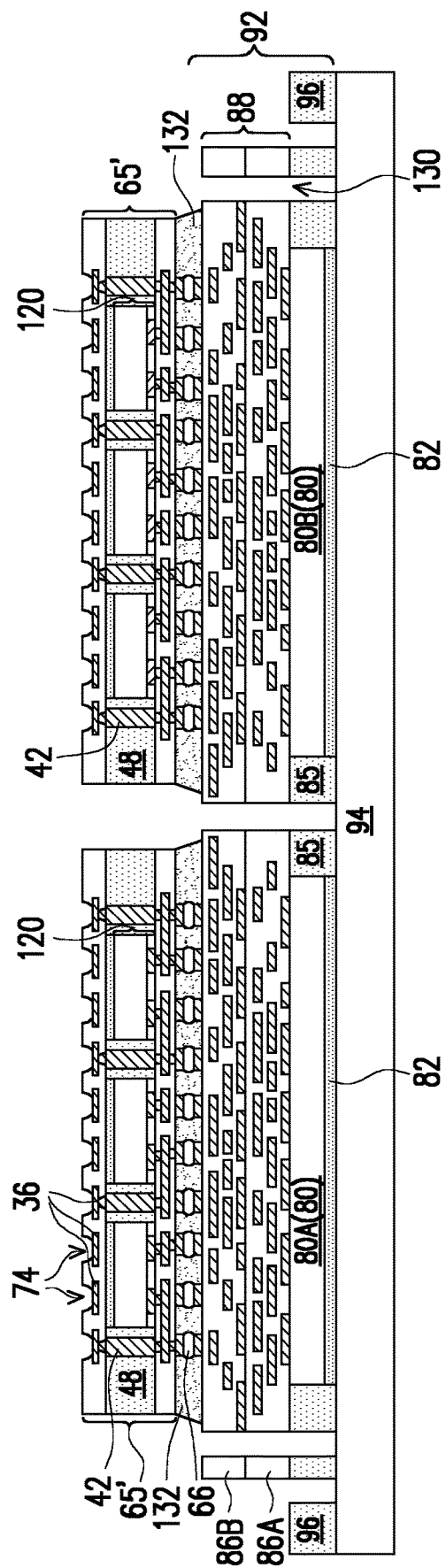

Referring to FIG. 25, IPD packages 65' are bonded to InFO package 92, for example, through solder regions 66 and possibly some pre-solder formed as parts of electrical connectors 90. The respective process is illustrated as process 234 in the process flow 200 shown in FIG. 34. Underfill 132 is then dispensed between IPD packages 65' and InFO package 92 to protect solder regions 66, as illustrated in FIG. 26. In a subsequent process, a cleaning process may be performed, and the titanium layers (if formed) in RDLs 36 may be etched to reveal the copper portions of RDLs 36. Next, as also shown in FIG. 26, underfill 132 is dispensed into the gaps between IPD packages 65' and InFO package 92.

Figure 27:
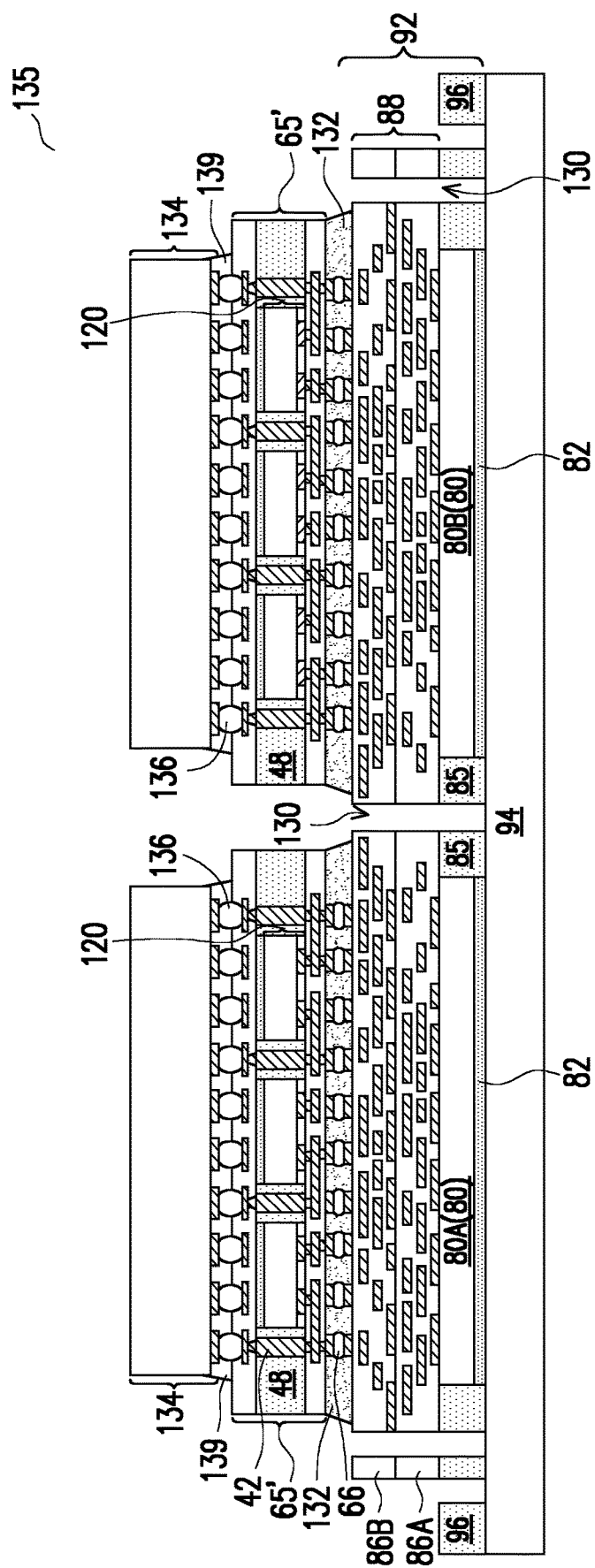

FIG. 27 illustrates the bonding of power modules 134 to IPD packages 65', for example, through solder regions 136. The respective process is illustrated as process 236 in the process flow 200 shown in FIG. 34. Underfill 139 is then dispensed between power modules 134 and IPD packages 65' to protect solder regions 136. Throughout the description, the components over tape 94 are collectively referred to as composite package 135 or reconstructed wafer 135. In accordance with some embodiments of the present disclosure, power modules 134 include Pulse Width Modulation (PWM) circuits for regulating power. Power modules 134 provide the regulated power to the underlying device dies 80, for example, through through-vias 42 and interconnect structure 88. Power modules 134 are also connected to the passive devices in IPD module 120 for power management and power storage.

FIG. 28 illustrates the installation of cold plate (heat dissipating plate) 146 on reconstructed wafer 135 through Thermal Interface Material (TIM) 144, which is an adhesive having good thermal conductivity. The respective process is illustrated as process 238 in the process flow 200 shown in FIG. 34. Brace 142 is installed through screws 138 and bolts 140. The respective process is also illustrated as process 238 in the process flow 200 shown in FIG. 34. In accordance with some embodiments, the bottom surface of brace 142 is in contact with the top surfaces of IPD packages 65'. Brace 142 may be formed of a metallic material such as copper, stainless steel, or the like. In a top view as shown in FIG. 31, brace 142 may form a grid including a plurality of horizontal strips 142A and a plurality of vertical strips 142B joined together. Brace 142, screws 138 and bolts 140 are in combination used for securing reconstructed wafer 135 and cold plate 146, and are used for reducing the warpage of reconstructed wafer 135.

Figure 29:
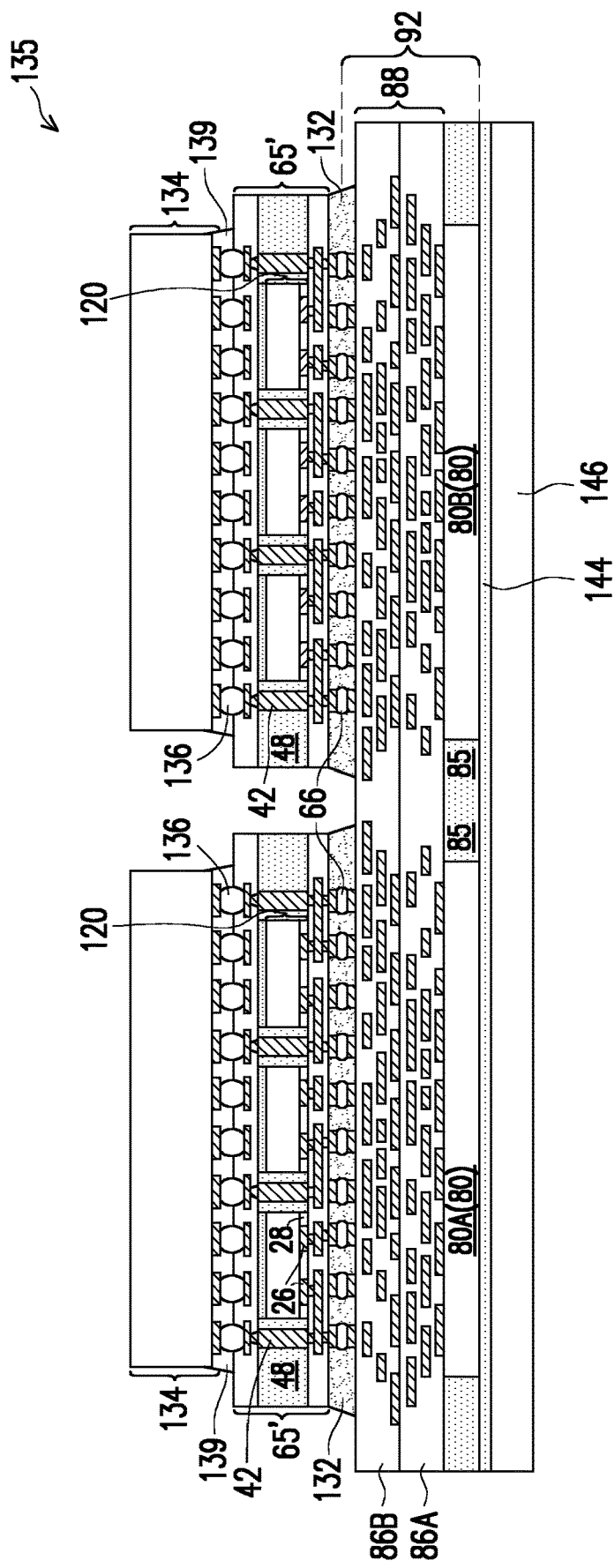
FIGS. 29 and 30 illustrate the cross-sectional views of IPD-containing InFO packages in accordance with some embodiments.
Figure 30:
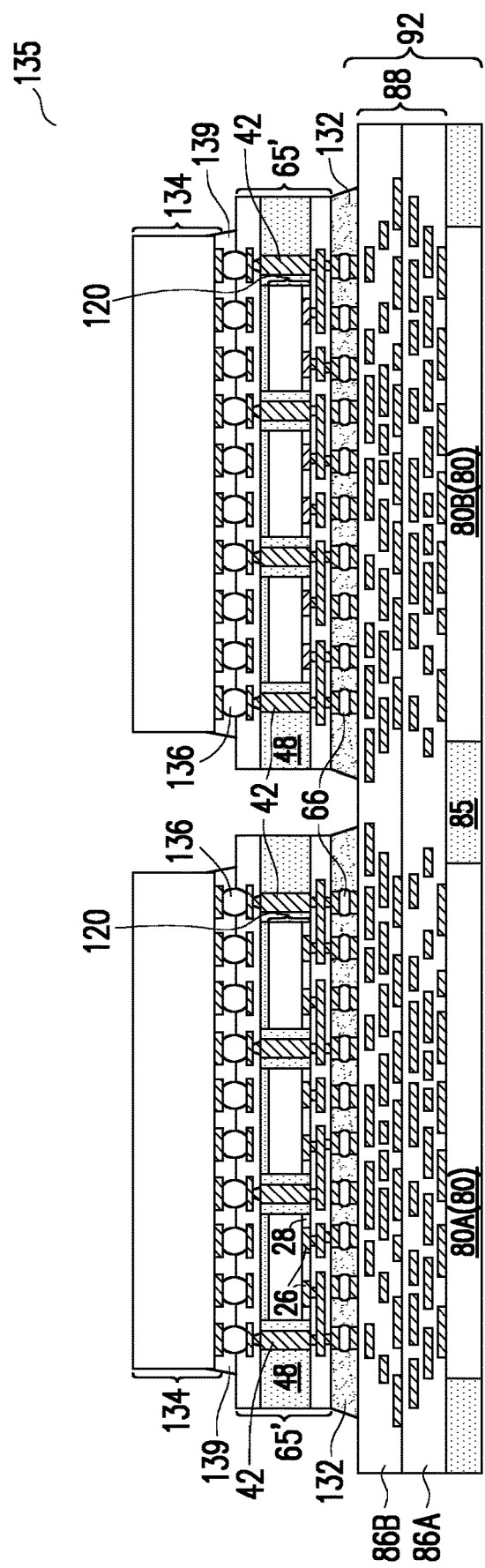

FIG. 29 illustrates reconstructed wafer 135 in accordance with alternative embodiments. These embodiments are similar to the embodiments as shown in FIG. 28, except no brace, screws, and bolts are installed. FIG. 30 illustrates reconstructed wafer 135 in accordance with yet alternative embodiments. These embodiments are similar to the embodiments as shown in FIG. 29, except no cold plate is installed.

Figure 10:
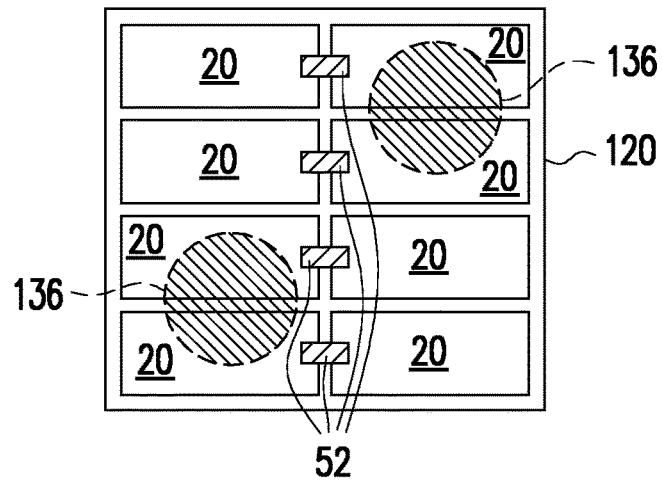
Figure 11:
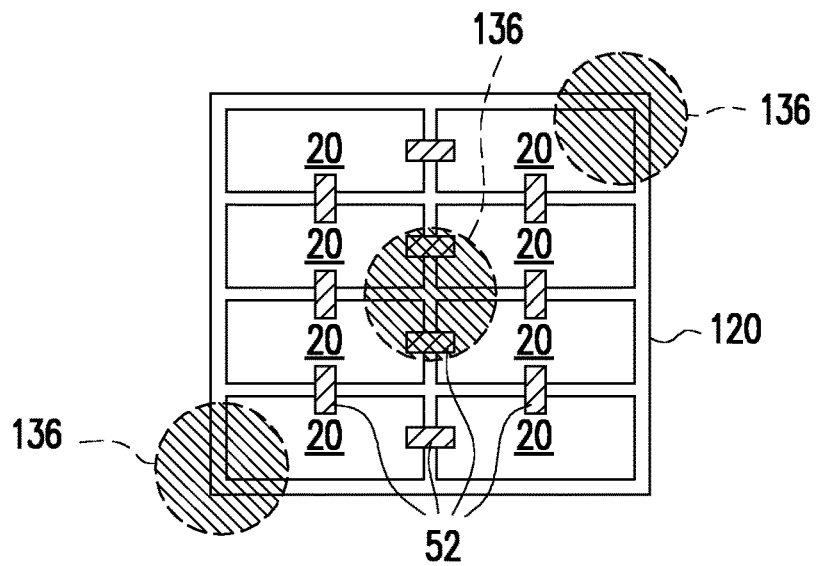

FIGS. 10 and 11 illustrate a schematic top view of IPD module 120 and solder region 136 (refer to FIG. 27) in accordance with some embodiments. It is observed that since solder regions 136 (also refer to FIG. 28, 29, or 30) are over IPD module 120, while the terminal 26 are on the bottom side of IPD module 120, the connection to terminals 26 (FIGS. 10 and 11) is flexible, and the connection (such as RDLs 52) can be placed in any desirable position without interfering the position of solder regions 136. The IPD dies 20 in IPD module 120 may thus be grouped through RDLs 52 in any combination to have desirable number of passive devices (such as capacitors) through parallel connection, serial connection, or combinations thereof.

FIG. 32 illustrates a plane view of an example reconstructed wafer 135. In accordance with some embodiments of the present disclosure, logic computing dies 80-1, IPD packages 65', and power modules 134 may be stacked to form a plurality of groups, and the groups of stacks are arranged as an array having a plurality of rows and a plurality of columns. Memory dies 80-2 and IO dies 80-3 may be formed in the peripheral regions of the array. Connectors 148 are used for connecting reconstructed wafer 135 to external devices for signal and/or power connection purpose. Connectors 148 may be sockets in accordance with some embodiments.

Figure 33:
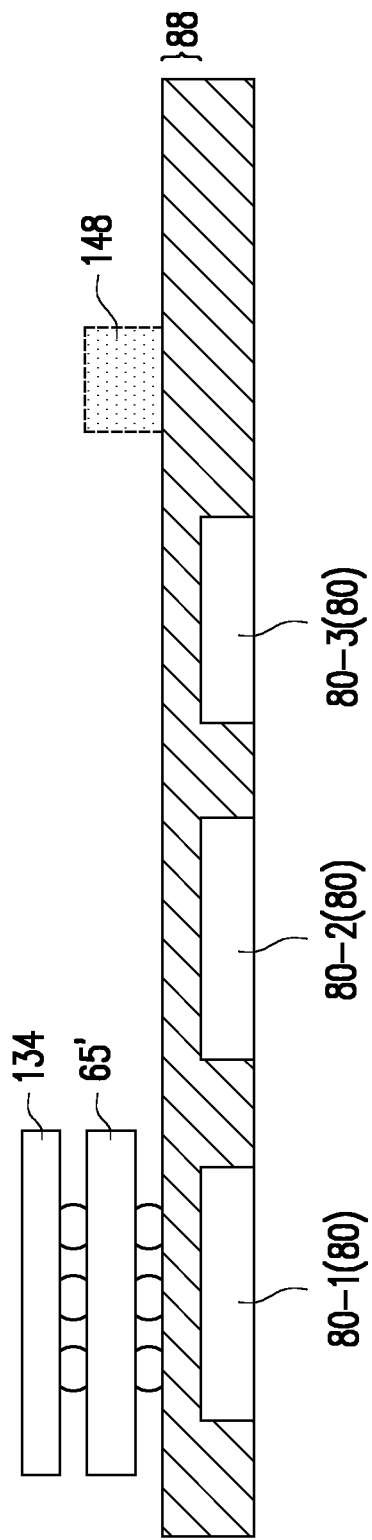
FIG. 33 illustrates a schematic cross-sectional view of some components in a system including an IPD-containing InFO package in accordance with some embodiments.

FIG. 33 schematically illustrates the vertical relative positions of logic computing dies 80-1, memory dies 80-2, IO dies 80-3, IPD package 65', power module 134, and connector 148. It shows that connectors 148 are formed over interconnect structure 88, which is over device dies 80.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Conventionally, IPD dies were bonded to the front side of InFO packages, and were at the same level as power modules. Accordingly, the IPD dies compete with electrical connectors (such as solder regions) for chip areas. This may force the sizes of the solder regions to be undesirably reduced, and force the current density in the solder regions to be undesirably increased. Also, lateral routing of the power is needed to laterally interconnecting the IPD dies and the power modules, and the lateral routing paths are long, which causes the degradation in performance. In the embodiments of the present disclosure, IPD dies are encapsulated in IPD packages, so that they can be stacked directly underlying the power modules, and hence the areas are saved. Also, the routing path of power is reduced due to the short vertical distance between the IPD dies and the power modules. Furthermore, the connection of the IPD dies is flexible, making is flexible to form passive devices with the desirable capacitance, resistance, and/or inductance values.

In accordance with some embodiments of the present disclosure, a package comprises a first package comprising a first device die; and a first encapsulant encapsulating the first device die therein; a second package over and bonded to the first package, the second package comprising an IPD die; and a second encapsulant encapsulating the IPD die therein; and a power module over and bonded to the second package. In an embodiment, the IPD die is a part of an IPD module comprising a plurality of IPD dies identical to the IPD die. In an embodiment, the IPD die and the plurality of IPD dies are electrically interconnected. In an embodiment, the IPD die comprises a passive device, and the IPD die is free from active devices and additional passive devices. In an embodiment, the second package and the power module form a package stack, and the package further comprises a plurality of package stacks identical to the package stack over and bonded to the first package. In an embodiment, the package stack and the plurality of package stacks in combination form an array. In an embodiment, the package further comprises a metallic brace over and contacting the second package; a screw penetrating through the first package; and a bolt, wherein the bolt and the screw secure the metallic brace on the first package. In an embodiment, the package further comprises a first plurality of solder regions bonding the first package to the second package; and a second plurality of solder regions bonding the second package to the power module. In an embodiment, the package further comprises a second device die encapsulated in the first encapsulant, wherein the first device die is a part of a die array comprising a plurality of device dies identical to the first device die, and the second device die is in a peripheral region of the die array.

In accordance with some embodiments of the present disclosure, a package comprises an IPD package comprising an IPD die module comprising a plurality of IPD dies therein, wherein each of the plurality of IPD dies comprises a passive device; a first molding compound molding the IPD module therein; a first plurality of redistribution lines underlying the first molding compound, wherein the first plurality of redistribution lines interconnects passive devices in the plurality of IPD dies as an additional passive device; and a second plurality of redistribution lines on an opposite side of the first molding compound than the first plurality of redistribution lines, wherein the first and the second plurality of redistribution lines are electrically interconnected; and a power module over and bonded to the IPD package. In an embodiment, the package further comprises an additional package underlying and bonded to the IPD package, wherein the additional package comprises a logic computing die, a memory die, and an IO die; and a second molding compound molding the logic computing die, the memory die, and the IO die therein. In an embodiment, the package further comprises a through-via in the first molding compound, wherein the through-via electrically interconnects the first and the second plurality of redistribution lines.

In accordance with some embodiments of the present disclosure, a method comprises forming a first package comprising encapsulating an IPD die and a metal post in a molding compound; and forming first redistribution lines on opposite sides of the molding compound to connect to the IPD die and the metal post; bonding the first package to a second package; and bonding a power module to the first package, wherein the power module and the second package are on opposite sides of the first package. In an embodiment, the encapsulating the IPD die comprises encapsulating a first IPD module comprising a plurality of identical IPD dies, wherein the plurality of identical IPD dies are unsawed apart from each other. In an embodiment, the first redistribution lines interconnect the plurality of identical IPD dies. In an embodiment, in the encapsulating, a second IPD module identical to the first IPD module is encapsulated in the molding compound, and the first IPD module is separated from the second IPD module by the molding compound. In an embodiment, the method further comprises attaching a cold plate or a connector to the second package, wherein when the cold plate or the connector is attached, both the first IPD module and the second IPD module are in a same continuous region of the molding compound. In an embodiment, the IPD die comprises a single capacitor, and is free from active devices and other passive devices therein. In an embodiment, the method further comprises forming the second package, which comprises encapsulating a first device die in an encapsulant; and forming second redistribution lines electrically connecting to the first device die. In an embodiment, the method further comprises encapsulating a second device die and a third device die in the encapsulant, wherein the first device die comprises a logic computing die, the second device die comprises a memory die, and the third device die comprises an IO die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first package comprising:
      a first device die; and
      a first encapsulant encapsulating the first device die therein;
   a second package over and bonded to the first package, the second package comprising:
      an Independent Passive Device (IPD) module comprising a plurality of IPD dies identical to each other, wherein each of the plurality of IPD dies is physically joined to respective neighboring IPD dies in the plurality of IPD dies, and wherein top surfaces of the plurality of IPD dies are coplanar, and bottom surfaces of the plurality of IPD dies are coplanar; and
      a second encapsulant encapsulating the IPD module therein; and
   a power module over and bonded to the second package.

2. The package of claim 1, wherein the plurality of IPD dies are electrically interconnected.

3. The package of claim 1, wherein each of the plurality of IPD dies comprises a passive device, and the IPD die is free from active devices and additional passive devices.

4. The package of claim 1, wherein the second package and the power module form a package stack, and the package further comprises a plurality of package stacks identical to the package stack over and bonded to the first package.

5. The package of claim 1, wherein each of the plurality of IPD dies comprises a semiconductor substrate, and the semiconductor substrates of the plurality of IPD dies are joined to form a continuous semiconductor region.

6. The package of claim 1 further comprising:
   a metallic brace over and contacting the second package;
   a screw penetrating through the first package; and
   a bolt, wherein the bolt and the screw secure the metallic brace on the first package.

7. The package of claim 1 further comprising:
   a first plurality of solder regions bonding the first package to the second package; and
   a second plurality of solder regions bonding the second package to the power module.

8. The package of claim 7 further comprising:
   a second device die encapsulated in the first encapsulant, wherein the first device die is a part of a die array comprising a plurality of device dies identical to the first device die, and the second device die is in a peripheral region of the die array.

9. The package of claim 1, wherein each of the plurality of IPD dies is free from active devices.

10. A package comprising:
    an Independent Passive Device (IPD) package comprising:
       an Independent Passive Device (IPD) module comprising a plurality of IPD dies therein, wherein each of the plurality of IPD dies comprises a passive device;
       a first molding compound molding the IPD module therein;
       a first plurality of redistribution lines underlying the first molding compound, wherein the first plurality of redistribution lines interconnects passive devices in the plurality of IPD dies as an additional passive device; and
       a second plurality of redistribution lines on an opposite side of the first molding compound than the first plurality of redistribution lines, wherein the first and the second plurality of redistribution lines are electrically interconnected;

a power module over and bonded to the IPD package;

an additional package underlying and bonded to the IPD package, wherein the additional package comprises:

a logic computing die, a memory die, and an Input-Output (IO) die; and a second molding compound molding the logic computing die, the memory die, and the IO die therein.

11. The package of claim 10 further comprising a through-via in the first molding compound, wherein the through-via electrically interconnects the first and the second plurality of redistribution lines.

12. The package of claim 10, wherein the IPD module is free from active devices therein.

13. A method comprising:

forming a first package comprising:

encapsulating a first Independent Passive Device (IPD) module and a metal post in a molding compound, wherein the first IPD module comprises a plurality of identical IPD dies, and wherein the plurality of identical IPD dies are unsawed apart from each other; and forming first redistribution lines on opposite sides of the molding compound to connect to the IPD module and the metal post;

bonding the first package to a second package; and bonding a power module to the first package, wherein the power module and the second package are on opposite sides of the first package.

14. The method of claim 13, wherein the first redistribution lines interconnect the plurality of identical IPD dies.

15. The method of claim 13, wherein in the encapsulating, a second IPD module identical to the first IPD module is encapsulated in the molding compound, and the first IPD module is separated from the second IPD module by the molding compound.

16. The method of claim 15 further comprising attaching a cold plate or a connector to the second package, wherein when the cold plate or the connector is attached, both the first IPD module and the second IPD module are in a same continuous region of the molding compound.

17. The method of claim 13, wherein each of the plurality of identical IPD dies comprises a single capacitor, and is free from active devices and other passive devices therein.

18. The method of claim 13 further comprising forming the second package comprising:

encapsulating a first device die in an encapsulant; and forming second redistribution lines electrically connecting to the first device die.

19. The method of claim 18 further comprising:

encapsulating a second device die and a third device die in the encapsulant, wherein the first device die comprises a logic computing die, the second device die comprises a memory die, and the third device die comprises an Input-Output (TO) die.

* * * * *

UNITED STATES PATENT AND TRADEMARK OFFICE
CERTIFICATE OF CORRECTION

PATENT NO. : 11,088,125 B2
APPLICATION NO. : 16/572798
DATED : August 10, 2021
INVENTOR(S) : Yu-Chia Lai Page 1 of 1

It is certified that error appears in the above-identified patent and that said Letters Patent is hereby corrected as shown below:

In the Claims

Claim 19, Column 14, Line 29; delete "(TO)" and insert --(IO)--

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*